(12) United States Patent
Watanabe

(10) Patent No.: US 7,889,568 B2
(45) Date of Patent: Feb. 15, 2011

(54) MEMORY, MEMORY OPERATING METHOD, AND MEMORY SYSTEM

(75) Inventor: Keisuke Watanabe, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 24 days.

(21) Appl. No.: 12/502,592

(22) Filed: Jul. 14, 2009

(65) Prior Publication Data
US 2010/0080066 A1 Apr. 1, 2010

(30) Foreign Application Priority Data
Sep. 26, 2008 (JP) ............................. 2008-247604

(51) Int. Cl.
*G11C 16/06* (2006.01)
(52) U.S. Cl. .................... 365/185.23; 365/185.18; 365/185.05
(58) Field of Classification Search ............ 365/185.12, 365/185.17, 185.18, 185.23, 185.25, 189.05, 365/203
See application file for complete search history.

(56) References Cited

U.S. PATENT DOCUMENTS

| | | | |
|---|---|---|---|
| 5,546,341 A * | 8/1996 | Suh et al. ............... | 365/185.33 |
| 7,116,583 B2 * | 10/2006 | Sander et al. ........... | 365/185.28 |
| 7,212,443 B2 | 5/2007 | Furuyama | |
| 7,466,596 B2 * | 12/2008 | Ausserlechner et al. | 365/185.23 |
| 2005/0270851 A1 | 12/2005 | Kato et al. | |
| 2007/0285984 A1 | 12/2007 | Kato et al. | |

FOREIGN PATENT DOCUMENTS

| | | |
|---|---|---|
| JP | 2004-199837 A | 7/2004 |
| JP | 2005-346819 A | 12/2005 |

* cited by examiner

*Primary Examiner*—Gene N Auduong
(74) *Attorney, Agent, or Firm*—Arent Fox LLP

(57) ABSTRACT

A memory includes a plurality of memory cells each of which includes a memory transistor and a selection transistor; a control gate line; a selection gate line; a source line; a bit line; a first driver that sets the control gate line and the selection gate line at a first voltage in a program operation; a second driver that sets the source line at a second voltage in the program operation, and sets the source line at a third voltage higher than the second voltage while the control gate line and the selection gate line are set at the first voltage; and a third driver that sets the bit line at a fourth voltage after the source line is set at the second voltage, the bit line being coupled to a memory cell being programmed.

9 Claims, 18 Drawing Sheets

FIG. 8

| | RD | PGM | ERS |
|---|---|---|---|
| CG1 | VRD(3V) | VH(9V) | VM(-9V) |
| SG1 | VCC(1.8V) | VCC(1.8V) | OPEN |
| SL1 | GND(0V) | VCC(1.8V) → VSL(6V) | OPEN |
| BL2 | VBL(1V) | VCC-Vth → GND(6V) | OPEN |
| CG0, 2-3 | VRD(3V) | GND(0V) | VM(-9V) |
| SG0, 2-3 | GND(0V) | GND(0V) | OPEN |
| SL0, 2-3 | GND(0V) | GND(0V) | OPEN |
| BL0-1,3 | OPEN | VCC-Vth | OPEN |
| PWEL | GND(0V) | GND(0V) | VH(9V) |

MEMORY, MEMORY OPERATING METHOD, AND MEMORY SYSTEM

CROSS-REFERENCE TO RELATED APPLICATIONS

The present Application for Patent claims the benefit of priority from Japanese Patent Application No. 2008-247604 filed on Sep. 26, 2008, the entire contents of which are incorporated herein by reference.

BACKGROUND

1. Field

The embodiments discussed herein relate to a memory.

2. Description of Related Art

Memories, such as a flash memory, programs, for example, writes and erases, to a memory cell using a voltage higher than a power supply voltage. A withstand voltage of a memory transistor for retaining data is higher than a withstand voltage of an ordinary transistor. Because the high-withstand-voltage transistor has a thick gate insulating film, a threshold voltage is high and an operating speed is slow. In order to make the operating speed of the memory cell faster, the memory includes the memory cell in which transistors having the high withstand voltages and selection transistors having the ordinary withstand voltages are arranged in series. For example, Japanese Laid-open Patent Publication Nos. 2005-346819 and 2004-199837 disclose the related art.

SUMMARY

According to one aspect of embodiments, a memory includes: a plurality of memory cells each of which includes a memory transistor and a selection transistor coupled to the memory transistor; a control gate line commonly coupled to gates of the memory transistors; a selection gate line commonly coupled to gates of the selection transistors; a source line commonly coupled to the memory cells; a bit line coupled to each of the memory cells; a first driver that sets the control gate line and the selection gate line at a first voltage in a program operation of the memory cell; a second driver that sets the source line at a second voltage in the program operation, and sets the source line at a third voltage higher than the second voltage while the control gate line and the selection gate line are set at the first voltage; and a third driver that sets the bit line at a fourth voltage after the source line is set at the second voltage, the bit line being coupled to a memory cell being programmed.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 8 illustrates an exemplary an operating voltage at a memory;

DESCRIPTION OF EMBODIMENTS

A memory transistor is coupled to a common source line, and a selection transistor is coupled to a bit line. In a programmed memory cell, a gate of the memory transistor and a gate of the selection transistor are set at a high level. The source line coupled to the programmed memory cell is set at the high level. The bit line coupled to the programmed memory cell is set at a low level. A current passes through a channel region of the memory transistor in the programmed memory cell, thereby generating hot electrons. The hot electrons are trapped by a floating gate of the memory transistor and the memory cell is programmed.

In another memory cell coupled to the source line to which the programmed memory cell is coupled, the current may pass through the channel region of the memory transistor by the high-level source line. In order to prevent the current from passing through the channel of another memory cell, the bit line that is not used in the program operation is set at the high level. For example, the bit line is set at the high level by a constant-current circuit and a switch circuit, which are coupled to the bit lines.

For example, a control signal is supplied in each switch circuit. A decode circuit decodes an address. Therefore, a circuit scale of a memory cell array and a circuit scale of a peripheral circuit may be enlarged. Further, since the constant-current circuit and the switch circuit are coupled to the bit line, a load on the bit line may be increased and an operating speed of the memory cell becomes slow.

It is preferable that a simple circuit sets a voltage at the bit line of the non-programmed memory cell without delaying the operating speed of the memory cell.

In FIGS. 1 to 18, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol prefixed with a symbol "/" indicates a negative logic. A double-square symbol represents an external terminal such as a pad on a semiconductor chip or a lead of a package containing the semiconductor chip therein. Terminals and signals supplied through the terminals, respectively, are denoted by like reference symbols.

Figure 1:
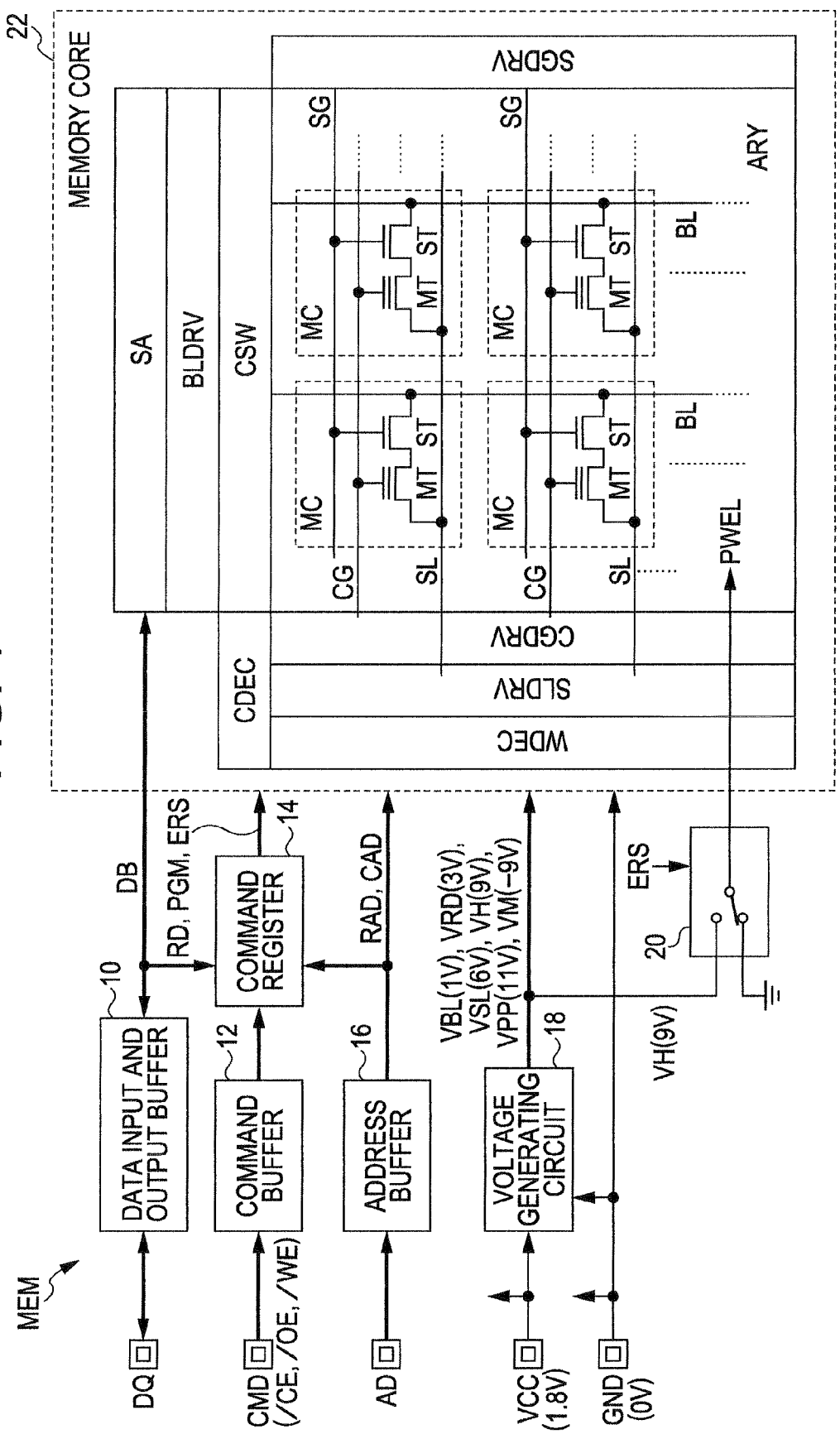
FIG. 1 illustrates a first embodiment.

FIG. 1 illustrates a first embodiment. For example, a memory MEM may be a NOR type flash memory. The memory MEM may operate in synchronization with a clock. The memory MEM may operate in asyncronization with the clock. The memory MEM may be a memory macro (IP) mounted on a system LSI. The memory MEM may be a semiconductor memory device enclosed in a package.

For example, the memory MEM is formed on a silicon substrate with a CMOS process. The memory MEM includes a data input and output buffer 10, a command buffer 12, a command register 14, an address buffer 16, a voltage generating circuit 18, a well switch 20, and a memory core 22.

The data input and output buffer 10 supplies read data, which is supplied from the memory core 22, through a data bus DB, to a data terminal DQ. The data input and output buffer 10 supplies write data, which is supplied to the data terminal DQ, to the memory core 22 through the data bus DB. In one embodiment, the number of bits of the data terminal DQ may be 16 bits.

The command buffer 12 receives a command signal CMD for operating the memory core 22, and the command buffer 12 supplies the received command signal CMD to the command register 14. For example, the command signal CMD includes a chip enable signal /CE, an output enable signal /OE, or a write enable signal /WE. The command register 14 supplies a control signal, such as a timing signal, for operating the memory core 22 to the memory core 22 in response to the command signal CMD supplied from the command buffer 12 and at least one bit of a data signal DB, an address signal RAD, and an address signal CAD.

The control signal includes a read signal RD, a program signal PGM, or an erase signal ERS. The read signal RD is supplied when a read operation for reading data from a memory cell MC is performed in response to a read command. The program signal PGM is supplied when a program operation (write operation) for programming a value "0" into the memory cell MC is performed in response to a program command. The erase signal ERS is supplied when an erase operation for erasing the memory cell MC into a logical "1" state is performed in response to an erase command.

The address buffer 16 supplies a high-order bit of an address signal AD received at an address terminal as a row address signal RAD, and the address buffer 16 supplies a low-order bit of the address signal AD as a column address signal CAD. The accessed memory cell MC is selected by the row address signal RAD and the column address signal CAD. The row address signal RAD selects a control gate line CG, a selection gate line SG, and a source line SL. The column address signal CAD selects a bit line BL.

The voltage generating circuit 18 produces plural internal voltages based on a power supply voltage VCC, for example, 1.8V, which is supplied to a power supply terminal, and a ground voltage GND, for example, 0V. In one embodiment, the internal voltage includes: a bit line voltage VBL, for example, 1V, a read voltage VRD, for example, 3V, a source voltage VSL, for example, 6V, a high voltage VH, for example, 9V, a high voltage VPP, for example, 11V, and a negative voltage VM, for example, −9V. For example, a boosting circuit generates a voltage higher than the power supply voltage VCC. For example, a voltage that is lower than the power supply voltage VCC is generated by resistance division. The power supply voltage VCC and the ground voltage GND are also supplied to other circuits.

The well switch 20 sets a p-type well region PWEL of a memory cell array ARY at a high voltage VH, for example, 9V when receiving the high-level erase signal ERS during the erase operation. The well switch 20 sets the p-type well region PWEL at the ground voltage when receiving the low-level erase signal ERS during the erase operation. In one embodiment, the p-type well region PWEL may be channel regions (substrate region) of a memory transistor MT and a selection transistor ST.

The memory core 22 includes a word decoder WDEC, a column decoder CDEC, a source driver SLDRV, a control gate driver CGDRV, a selection gate driver SGDRV, a sense amplifier SA, a bit driver BLDRV, a column switch CSW, and the memory cell array ARY.

The word decoder WDEC generates a decode signal for selecting the control gate line CG, the selection gate line SG, and the source line SL in response to the row address signal RAD. The column decoder CDEC generates a decode signal for selecting the bit line BL in response to the column address signal CAD.

The source driver SLDRV selects one of the source lines SL in response to the decode signal supplied from the word decoder WDEC. The control gate driver CGDRV selects one of the control gate lines CG in response to the decode signal supplied from the word decoder WDEC. The selection gate driver SGDRV selects one of the selection gate lines SG in response to the decode signal supplied from the word decoder WDEC.

In one embodiment, during the read operation, the sense amplifier SA amplifies a data signal read from the memory cell MC through the bit line BL, and the sense amplifier SA outputs the amplified data signal as a read data signal DOUT. The sense amplifier SA determines logic of the data signal according to a current passing through the bit line BL.

The bit driver BLDRV sets the bit line BL at a given voltage during the read operation and the program operation. During the read operation and the program operation, the column switch CSW couples the bit driver BLDRV to the bit line BL coupled to the accessed memory cell MC in response to the decode signal supplied from the column decoder CDEC.

In one embodiment, the memory cell array ARY includes the plural memory cells MC that are arranged in a matrix. The control gate line CG, the source line SL, and the selection gate line SG are commonly coupled to a row of the memory cells MC that are arranged in a horizontal direction of FIG. 1. The bit line BL is commonly coupled to a column of the memory cells MC that are arranged in a vertical direction, for example, as depicted in FIG. 1. Each memory cell MC includes the memory transistor MT and the selection transistor ST, which are disposed in series between the source line SL and the bit line BL.

In one embodiment, the memory transistor MT may be an nMOS transistor, and the memory transistor MT includes a floating gate in which electrons are accumulated and a control gate coupled to the control gate line CG. The memory transistor MT may be formed using a trap gate in which electrons are accumulated in a given place. The selection transistor ST may be an nMOS transistor whose gate is coupled to the selection gate line SG.

For example, the selection transistor ST may be formed with a CMOS process having a withstand voltage of 2V. The selection transistor ST includes a thin gate insulating film, and the selection transistor ST operates at high speed. For example, the memory transistor MT may be formed with a CMOS process having a withstand voltage of 12V. The memory transistor MT has a thick gate insulating film, and the memory transistor MT operates at a speed slower than that of the selection transistor ST.

Figure 2:
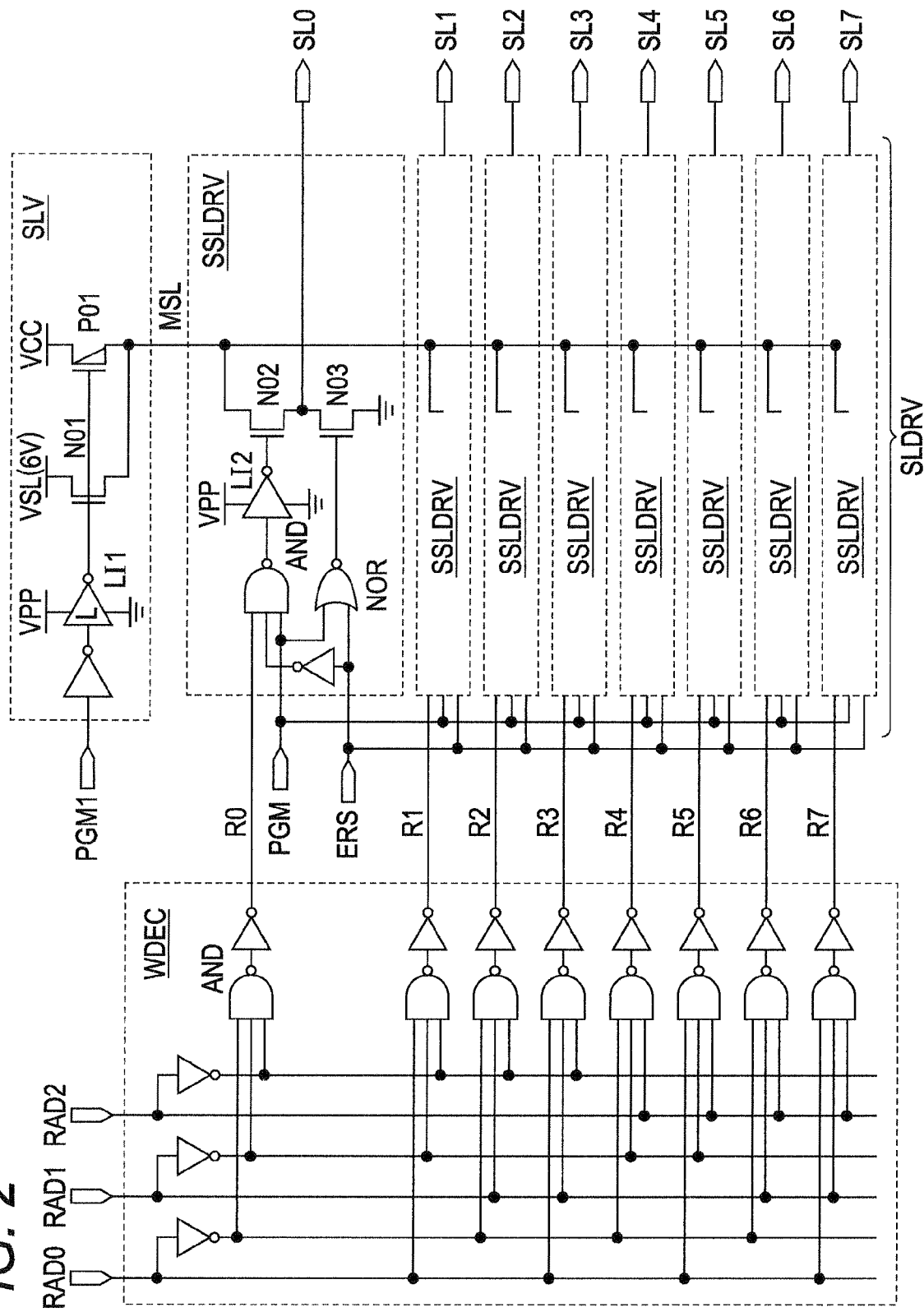
FIG. 2 illustrates an exemplary word decoder and an exemplary source driver.

FIG. 2 illustrates an exemplary word decoder and an exemplary source driver. The word decoder and the source driver may be the word decoder WDEC and the source driver SLDRV of FIG. 1. For example, a row address signal RAD is a three-bit signal (RAD0 to RAD2). In the memory MEM, for example, the row address signal RAD is an eight-bit signal. The word decoder WDEC may generate 256 row decode signals R0 to R255.

The word decoder WDEC includes an AND circuit that receives the row address signals RAD0 to RAD2 or inverted signals of the row address signals RAD0 to RAD2. For example, when the row address signals RAD0 to RAD2 are "000", the row decode signal R0 is changed to a high level. For example, when the row address signals RAD0 to RAD2 are "010", the row decode signal R2 is changed to the high level.

The source driver SLDRV includes a source voltage supply circuit SLV and plural sub-source drivers SSLDRV. The source voltage supply circuit SLV may be formed outside the source driver SLDRV.

The source voltage supply circuit SLV includes an nMOS transistor N01, a pMOS transistor P01, and an inverter LI1. The nMOS transistor N01 is disposed between a source voltage line VSL and a main source line MSL. The pMOS transistor P01 is disposed between a power supply line VCC and the main source line MSL. An output of the inverter LI1 is coupled to a gate of the nMOS transistor N01 and the gate of the pMOS transistor P01. For example, the nMOS transistor N01, the pMOS transistor P01, and the inverter LI1 are formed with the CMOS process having the withstand voltage of 12.

The inverter LI1 has a level conversion function. That is, the inverter LI1 outputs a low level, for example, the ground voltage GND when receiving a high level, for example, the power supply voltage VCC. The inverter LI1 outputs the high voltage VPP when receiving the low level, for example, the ground voltage GND. The source voltage supply circuit SLV couples the main source line MSL to the power supply line VCC when a program signal PGM1 is set at the low level, for example, when the program is not performed. The source voltage supply circuit SLV couples the main source line MSL to the high voltage line VPP when the program signal PGM1 is set at the high level, for example, when the program is performed. For example, the program signal PGM1 is generated at a given time behind the program signal PGM of FIG. 1. For example, the command register 14 of FIG. 1 generates the program signal PGM1. The source driver SLDRV of FIG. 2 may generate the program signal PGM1. For example, the source driver SLDRV includes a delay circuit that outputs the program signal PGM1 after a given time elapses from receiving the program signal PGM.

The sub-source driver SSLDRV is formed in each of the source lines SL (SL0 to SL7). Because the sub-source drivers SSLDRV have substantially the same configuration, the sub-source driver SSLDRV coupled to the source line SL0 will be described. The sub-source driver SSLDRV includes nMOS transistors N02 and N03, an AND circuit, and a NOR gate. The nMOS transistors N02 and N03 are disposed in series between the main source line MSL and the ground line GND via a connection node of the source line SL0. The AND circuit performs the level conversion. The AND circuit includes a NAND gate and an inverter LI2.

A gate of the transistor N02 is coupled to an output of the AND circuit. The AND circuit receives at least one of the program signal PGM, the erase signal ERS, and the row decode signal R0. A gate of the transistor N03 receives the inverted signal of the program signal PGM or the erase signal ERS through the NOR gate. For example, the nMOS transistors N02 and N03 and the inverter LI2 are formed with the CMOS process having the withstand voltage of 12V. For example, other circuits of the sub-source driver SSLDRV are formed with the CMOS process having the withstand voltage of 2V.

The sub-source driver SSLDRV couples the source line SL0 to the ground line GND when the program signal PGM and the erase signal ERS are at the low level. The sub-source driver SSLDRV couples the source line SL0 to the main source line MSL when the program signal PGM and the row decode signal R0 are at the high level. The sub-source driver SSLDRV puts the source line SL0 in a floating state, when the program signal PGM is at the high level and the row decode signal R0 is at the low level. The sub-source driver SSLDRV puts the source line SL in the floating state when the erase signal ERS is at high level.

Figure 3:
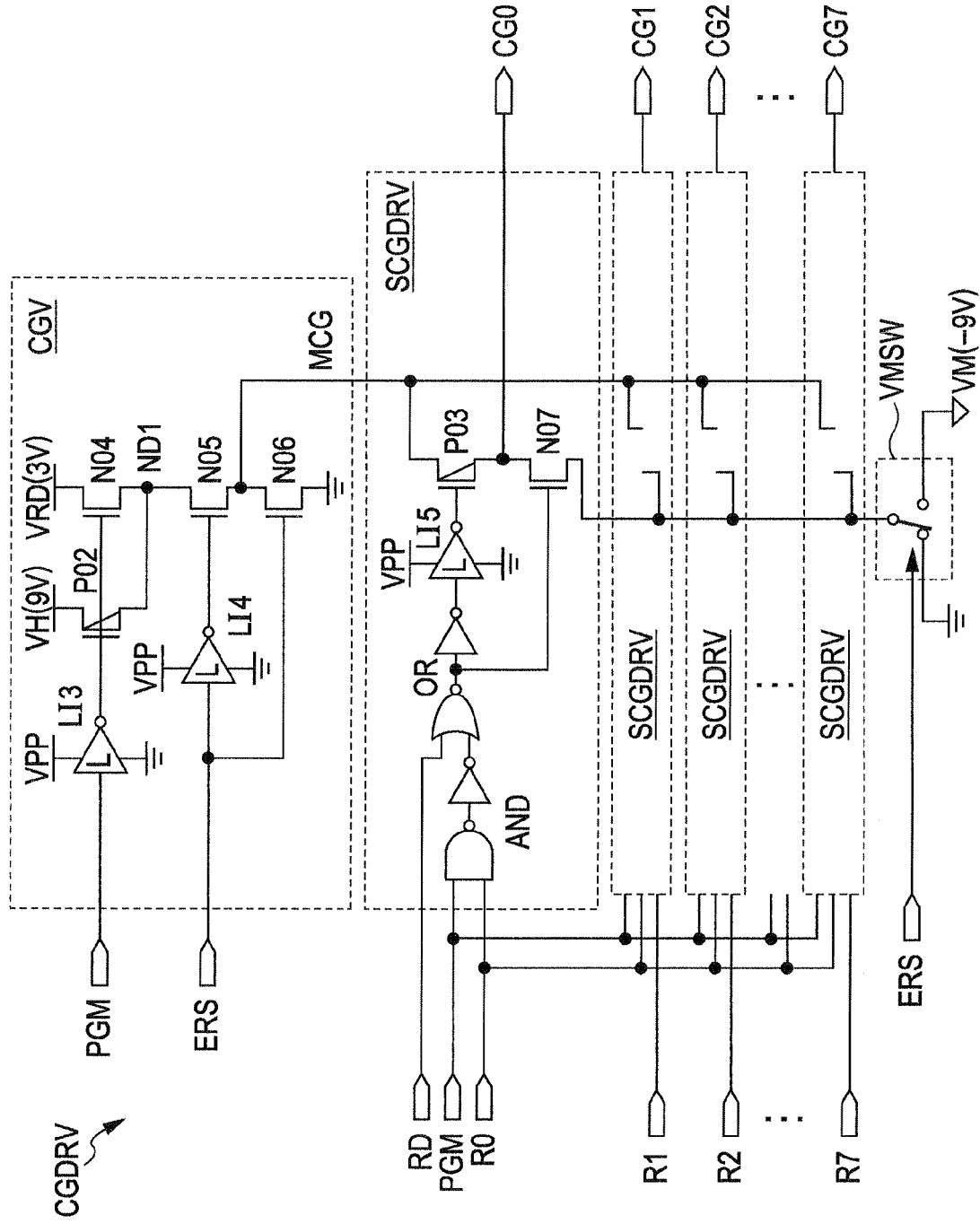
FIG. 3 illustrates an exemplary control gate driver.

FIG. 3 illustrates an exemplary control gate driver. The control gate driver may be the control gate driver CGDRV of FIG. 1. The control gate driver CGDRV includes a control voltage supply circuit CGV and plural sub-control gate drivers SCGDRV. The control voltage supply circuit CGV may be formed outside the control gate driver CGDRV.

The control voltage supply circuit CGV includes nMOS transistors N04, N05, and N06, a pMOS transistor P02, and inverters LI3 and LI4. The inverters LI3 and LI4 perform the level converting operation. The level conversion performed by the inverters LI3 and LI4 may be substantially the same as the level conversion performed by the inverter LI1 of FIG. 2. The nMOS transistors N04, N05, and N06 are disposed in series between a read voltage line VRD and a main control gate line MCG. The pMOS transistor P02 is disposed between the high voltage line VH and a node ND1. The node ND1 is a connection node between the nMOS transistor N04 and the nMOS transistor N05. The inverter LI3 inverts the input program signal PGM and supplies the inverted program signal PGM to the gates of the pMOS transistor P02 and nMOS transistor N04. The inverter LI4 inverts the input erase signal ERS and supplies the inverted program signal PGM to the gate of the nMOS transistor N05. The gate of the nMOS transistor N06 receives the erase signal ERS. For example, the pMOS transistor P02, the nMOS transistors N04, N05, and N06, and the inverters LI3 and LI4 are formed with the CMOS process having the withstand voltage of 12V.

The control voltage supply circuit CGV couples the main control gate line MCG to the high voltage line VH when receiving the high-level program signal PGM and the low-level erase signal ERS, for example, when the program is performed. The control voltage supply circuit CGV couples the main control gate line MCG to the ground line when receiving the high-level erase signal ERS irrespective of the level of the program signal PGM, for example, when the erase is performed. During the read operation, the program signal PGM and the erase signal ERS are set at the low level. The nMOS transistors N04 and N05 are turned on, the pMOS transistor P02 and the nMOS transistor N06 are turned off, and the main control gate line MCG is coupled to the read line VRD.

The sub-control gate driver SCGDRV is formed in each of the control gate lines CG (CG0 to CG7). For example, the seven control gate lines CG0 to CG7 are provided according to the three-bit row address signals RAD0 to RAD2 of FIG. 2. For example, when the row address signal RAD is an eight-bit signal, the sub-control gate driver SCGDRV generates 256 control gate signals CG0 to CG255. Because the sub-control gate drivers SCGDRV have substantially the same configuration, the sub-control gate driver SCGDRV coupled to the control gate line CG0 will be described.

The sub-control gate driver SCGDRV includes a pMOS transistor P03, an nMOS transistor N07, an AND circuit, an OR circuit, and an inverter LI5. The pMOS transistor P03 and the nMOS transistor N07 are disposed in series between the main control gate line MCG and a negative voltage switch circuit VMSW via a connection node of the control gate line CG0. For example, the pMOS transistor P03, the nMOS transistor N07, and the inverter LI5 are formed with the CMOS process having the withstand voltage of 12V. Other circuits of the sub-control gate driver SCGDRV are formed with the CMOS process having the withstand voltage of 2V.

The gate of the transistor P03 is coupled to the output of the OR circuit through the inverter LI5. The inverter LI5 performs the level conversion. The level conversion performed by the inverter LI5 may be substantially the same as the level conversion performed by the inverter LI1 of FIG. 2. The OR circuit receives the read signal RD and the AND logic of the program signal PGM and the row decode signal R00. The gate of the transistor N07 receives the output of the NOR gate in the OR circuit.

The negative voltage switch circuit VMSW couples the source of the transistor N07 to the negative voltage line VM, for example, −9V when the erase signal ERS is at the high level, such as when the erase is performed. The negative voltage switch circuit VMSW couples the source of the transistor N07 to the ground line when the erase signal ERS is at the low level, such as when the erase is not performed.

The sub-control gate driver SCGDRV sets the control gate line CG0 at the read voltage VRD, for example, 3V when the read signal RD is at the high level. The sub-control gate driver SCGDRV sets the control gate line CG0 at the high voltage VH, for example, 9V when the program signal PGM and the row decode signal R0 are at the high level. The sub-control gate driver SCGDRV sets the control gate line CG0 at the negative voltage VM, for example, −9V when the erase signal ERS is at the high level. The sub-control gate driver SCGDRV sets the control gate line CG0 at the ground voltage when the read signal RD, the program signal PGM, and the erase signal ERS are at the low level.

Figure 4:
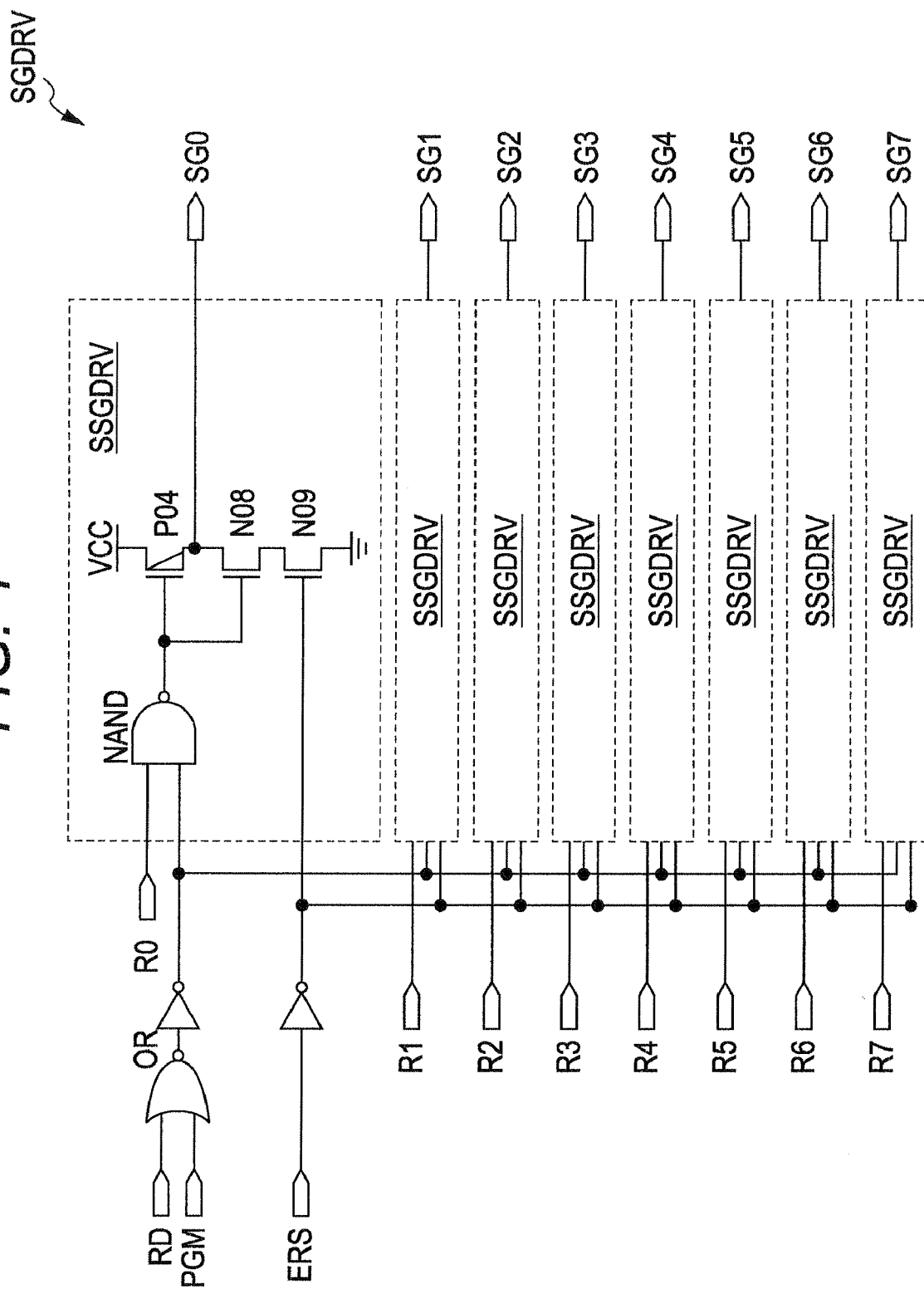
FIG. 4 illustrates an exemplary selection gate driver.

FIG. 4 illustrates an exemplary selection gate driver. The selection gate driver may be the selection gate driver SGDRV of FIG. 1. The selection gate driver SSGDRV includes plural sub-selection gate drivers SSGDRV. In one embodiment, the sub-selection gate driver SSGDRV is formed in each of the selection gate lines SG (SG0 to SG7). The seven selection gate lines SG0 to SG7 are provided according to the three-bit row address signal RAD0 to RAD2 of FIG. 2. When the row address signal RAD is an eight-bit signal, the sub-selection gate driver SSGDRV generates 256 selection gate signals SG0 to SG255. Because the sub-selection gate drivers SSGDRV have substantially the same configuration, the sub-selection gate driver SSGDRV coupled to the selection gate line SG0 will be described.

The sub-selection gate driver SSGDRV includes a pMOS transistor P04, nMOS transistors N08 and N09, and a NAND gate. The pMOS transistor P04 and the nMOS transistors N08 and N09 are disposed in series between the power supply line VCC and the ground line GND via a connection node of the selection gate line SG0. The connection node of the selection gate line SG0 is the drain nodes of the pMOS transistor P04 and nMOS transistor N08. For example, the sub-selection gate driver SSGDRV is formed with the CMOS process having the withstand voltage of 2V.

The gates of the pMOS transistor P04 and nMOS transistor N08 are coupled to the output of the NAND gate. The NAND gate receives the OR logic of the read signal RD and program signal PGM and the row decode signal R0. The gate of the nMOS transistor N09 receives the inverted signal of the erase signal ERS.

The sub-selection gate driver SSGDRV sets the selection gate line SG0 at the power supply voltage VCC, for example, 1.8V when the read signal RD and the row decode signal R0 are at the high level and the erase signal ERS is at the low level. The sub-selection gate driver SSGDRV sets the selection gate line SG0 at the power supply voltage VCC, for example, 1.8V when the program signal PGM and the row decode signal R0 are at the high level. The sub-selection gate driver SSGDRV sets the selection gate line SG0 at the ground voltage GND, for example, 0V when the read signal RD, the program signal PGM, and the erase signal ERS are at the low level. The sub-selection gate driver SSGDRV puts the selection gate line SG0 in the floating state, when the read signal RD and the program signal PGM are at the low level and the erase signal ERS is at the high level.

Figure 5:
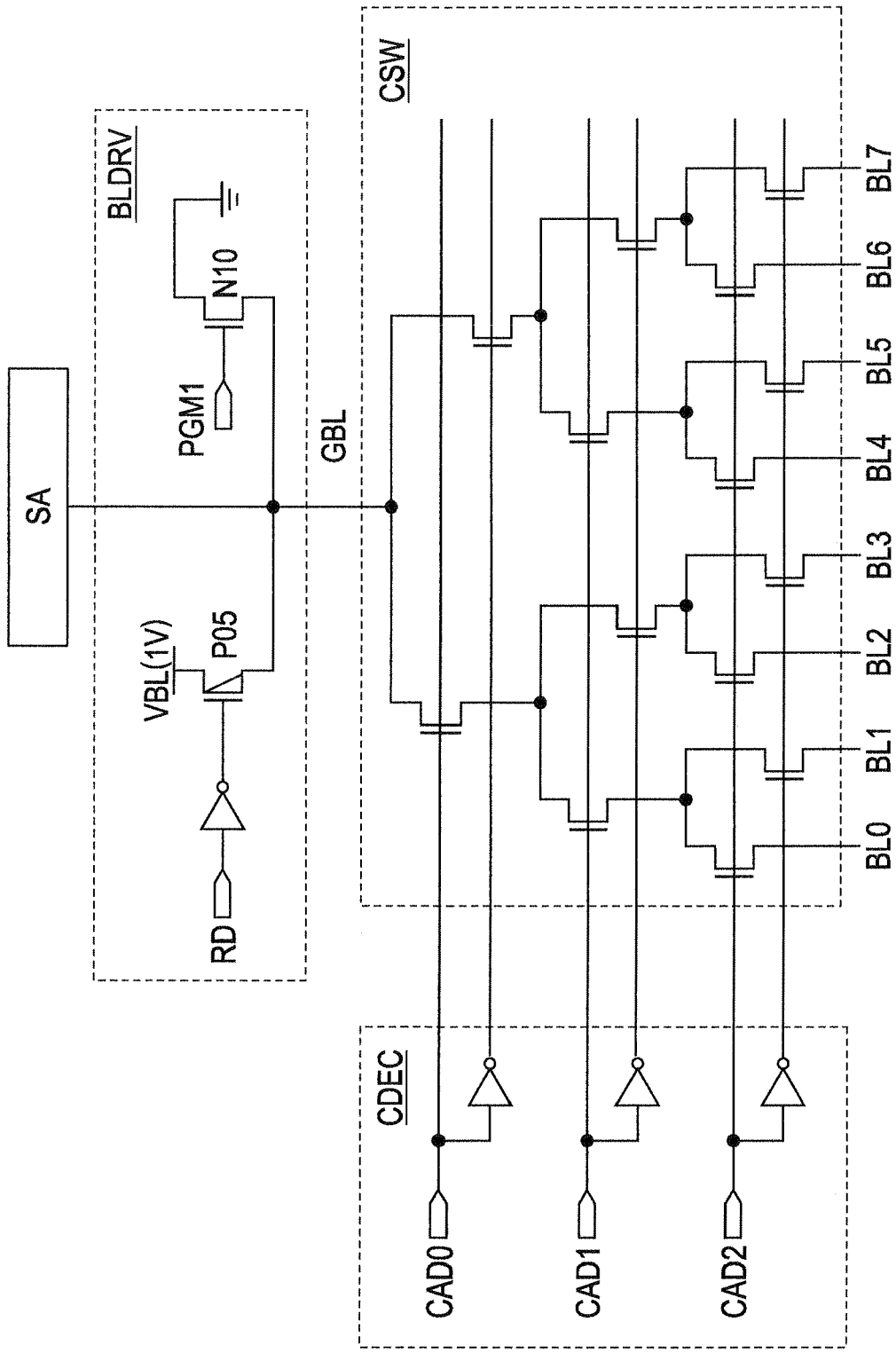
FIG. 5 illustrates an exemplary column decoder, an exemplary bit driver, and an exemplary column switch.

FIG. 5 illustrates an exemplary column decoder, an exemplary bit driver, and an exemplary column switch. The exemplary column decoder, the exemplary bit driver, and the exemplary column switch may be the column decoder CDEC, bit driver BLDRV, and column switch CSW of FIG. 1. FIG. 5 illustrates the circuit block corresponding to one data terminal DQ. For example, the circuit of FIG. 5 is formed in each data terminal DQ. For example, the column address signal CAD is a three-bit signal (CAD0 to CAD2) and the bit line BL is a sevenbit signal (BL0 to BL7). The column decoder CDEC includes an inverter that inverts the logic levels of the column address signals CAD to CAD2. For example, the memory MEM has the six-bit column address signal CAD and the 64 bit lines BL.

The bit driver BLDRV includes a PMOS transistor P05 and an nMOS transistor N10. The pMOS transistor P05 supplies the bit line voltage VBL, for example, 1V to a global bit line GBL when the read signal RD is at the high level. The nMOS transistor N10 supplies the ground voltage GND, for example, 0V to the global bit line GBL when the program voltage PGM1 is at the high level.

The column switch CSW includes a plurality of nMOS transistors that are arranged on a branch line which branches from the global bit line GBL to the bit lines BL0 to BL7. The gates of the nMOS transistors receive the column address signals CAD0 to CAD2 or the inverted signals of the column address signals CAD. The global bit line GBL is coupled to one of the bit lines BL0 to BL7 in response to the column address signals CAD0 to CAD2.

Figure 6:
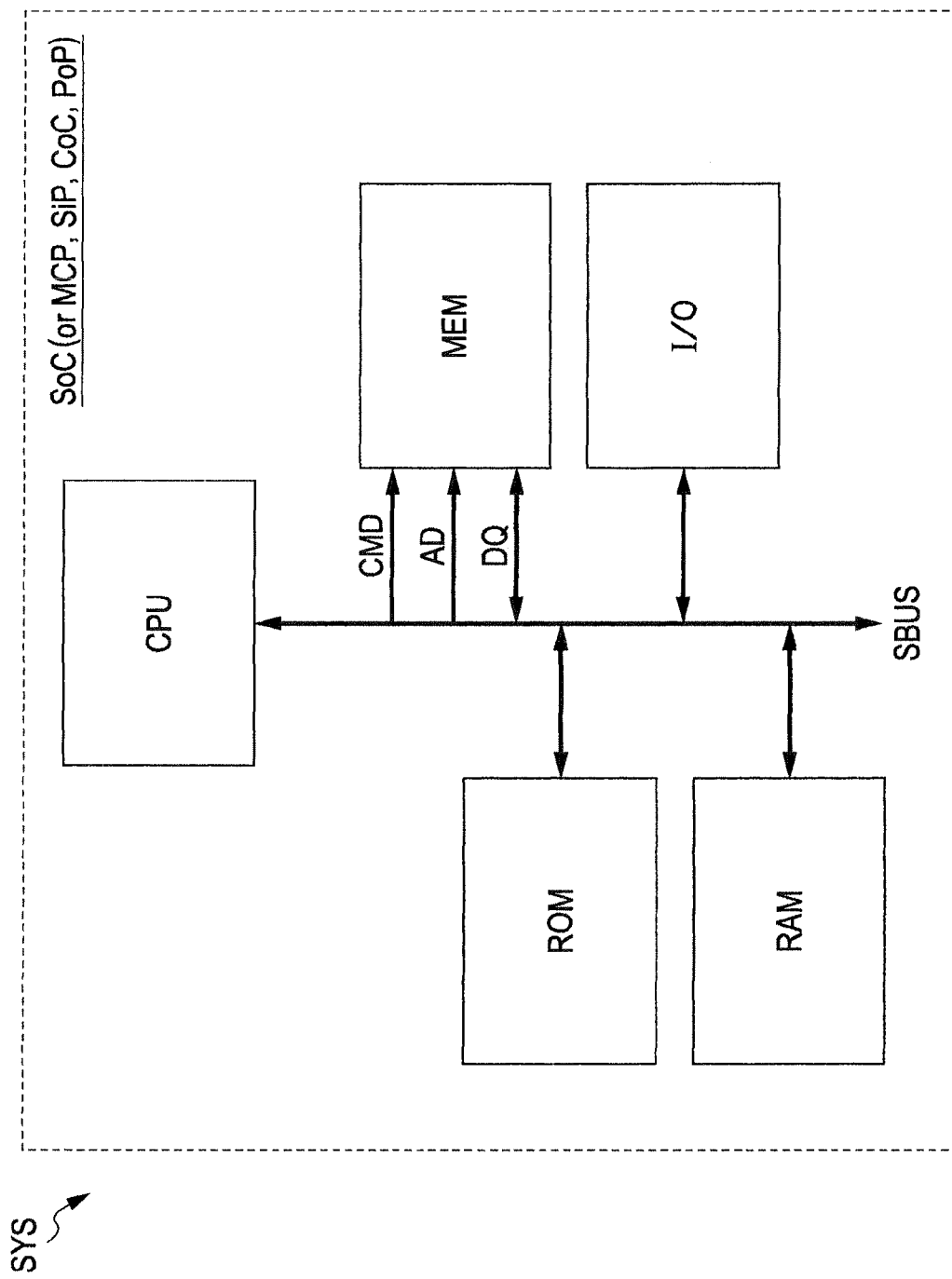
FIG. 6 illustrates an exemplary system.

FIG. 6 illustrates an exemplary system on which a memory is mounted. The memory MEM of FIG. 1 may be mounted on the exemplary system. For example, the system SYS (user system) may be part of a microcomputer system in a portable device. Memories of following embodiments may be mounted on the system SYS of FIG. 6. The system SYS may include a System on Chip (SoC) in which plural macros are integrated on a silicon substrate. The system SYS may include a Multi Chip Package (MCP) in which plural chips are laminated on a package substrate. The system SYS may include a System in Package (SiP) in which plural chips are mounted on a package substrate such as a lead frame. The system SYS may include a Chip on Chip (CoC) or a Package on Package (PoP).

For example, SoP includes CPU (controller), the memory MEM of FIG. 1, ROM, RAM, and a peripheral circuit I/O. CPU, the memory MEM, ROM, RAM, and the peripheral circuit I/O are coupled to one another through a system bus SBUS. CPU accesses the memory MEM, ROM, RAM, and the peripheral circuit I/O, and CPU controls the operation of the entire system. The memory MEM performs the read operation, the program operation, and the erase operation according to an access request from CPU. The system SYS may include CPU and the memory MEM.

Figure 7:
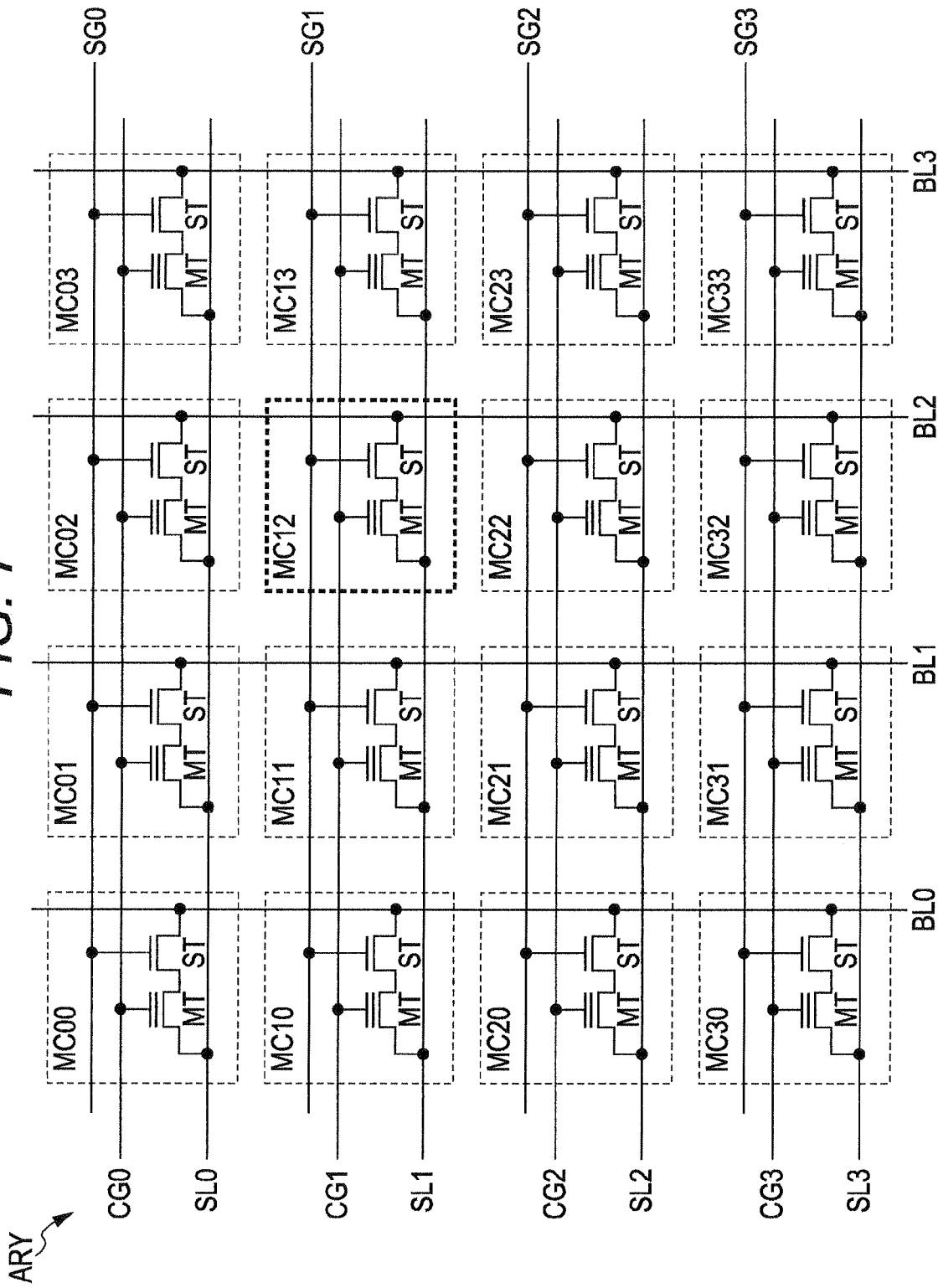
FIG. 7 illustrates an exemplary memory cell array.

FIG. 7 illustrates an exemplary memory cell array. The exemplary memory cell array of FIG. 7 may be the memory cell array ARY of FIG. 1. The depicted memory cell array ARY includes 16 memory cells MC (MC00 to MC03, MC10 to MC13, MC20 to MC23, MC30 to MC33) in a matrix. The control gate lines CG0 to CG3, the selection gate lines SG0 to SG3, and the source lines SL0 to SL3 are commonly coupled to the row of the memory cells MC that are arranged in the horizontal direction of FIG. 7. The control gate lines CG0 to CG3, the selection gate lines SG0 to SG3, and the source lines SL0 to SL3 are selected by the two-bit row address signals RAD0 to RAD1. The bit lines BL0 to BL3 are commonly coupled to the column of the memory cells MC that are arranged in the vertical direction of FIG. 7. The bit lines BL0 to BL3 are selected by the two-bit column address signals CAD0 to CAD1.

FIG. 8 illustrates an exemplary operating voltage at a memory. The memory may be the memory MEM of FIG. 1. The operation of the memory will be described with reference to the memory cell array ARY of FIG. 7. In the read operation RD and the program operation PGM, for example, a memory cell MC12 in a frame illustrated by a thick broken line of FIG. 7 is accessed. In the erase operation ERS, for example, all the memory cells MC are erased to the logical "1".

In the read operation RD, the control gate lines CG0 to CG3 are set at the read voltage VRD, for example, 3V. The selection gate line SG1 coupled to the memory cell MC12 from which the data is read is set at the power supply voltage VCC, for example, 1.8V. The source line SL1 coupled to the memory cell MC12 from which the data is read is set at the ground voltage GND, for example, 0V. The bit line BL2 coupled to the memory cell MC12 from which the data is read is set at the bit line voltage VBL, for example, 1V.

The selection gate lines SG0, SG2, and SG3 and the source lines SL0, SL2, and SL3, which are not coupled to the memory cell MC12 from which the data is read, are set at the ground voltage GND. The bit lines BL0, BL1, and BL3, which are not coupled to the memory cell MC12 from which the data is read, are put in the floating state, for example, OPEN. The p-type well region PWEL corresponding to the channel regions of the memory transistor MT and selection transistor ST are set at the ground voltage GND.

In the program operation PGM, the control gate line CG1 coupled to the memory cell MC12 in which the data is programmed is set at the high voltage VH, for example, 9V. The selection gate line SG1 coupled to the memory cell MC12 in which the data is programmed is set at the power supply voltage VCC. The source line SL1 coupled to the memory cell MC12 in which the data is programmed is set at the source voltage VSL, for example, 6V after being set at the power supply voltage VCC. The bit line BL2 coupled to the memory cell MC12 in which the data is programmed is set at a voltage VCC-Vth that is lower than the power supply voltage VCC by a threshold voltage Vth of the selection transistor ST, and then the bit line BL2 is set at the ground voltage GND.

The control gate lines CG0, CG2, and CG3 and the source lines SL0, SL2, and SL3, which are not coupled to the memory cell MC12 in which the data is programmed are set at the ground voltage GND. The selection gate lines SG0, SG2, and SG3, which are not coupled to the memory cell MC12 in which the data is programmed, are set at the ground voltage GND. The bit lines BL0, BL1, and BL3, which are not coupled to the memory cell MC12 in which the data is programmed, are set at the voltage VCC-Vth. The voltage VCC-Vth at the bit lines BL0, BL1, and BL3 is set without a precharge circuit. The well region PWEL is set at the ground voltage GND.

In the erase operation ERS, the control gate lines CG0 to CG3 are set at the negative voltage VM. The selection gate lines SG0 to SG3, the source lines SL0 to SL3, and the bit lines BL0 to BL3 are put in the floating state, for example, OPEN. The well region PWEL is set at the high voltage VH, for example, 9V. The electrons trapped in the floating gate are discharged to the well region PWEL, for example, a channel to lower the threshold voltage of the memory cell MC. The data in the memory cell MC is rewritten into the logical "1".

When the erase operation ERS is performed to a partial region of the memory cell MC, for example, a sector, the well region PWEL is divided at each of a given number of control gate lines CG. The negative voltage VM is applied to the control gate line CG provided in the sector to which the erase operation ERS is performed, and the high voltage VH is applied to the well region PWEL in the sector to which the erase operation ERS is performed.

Figure 9:
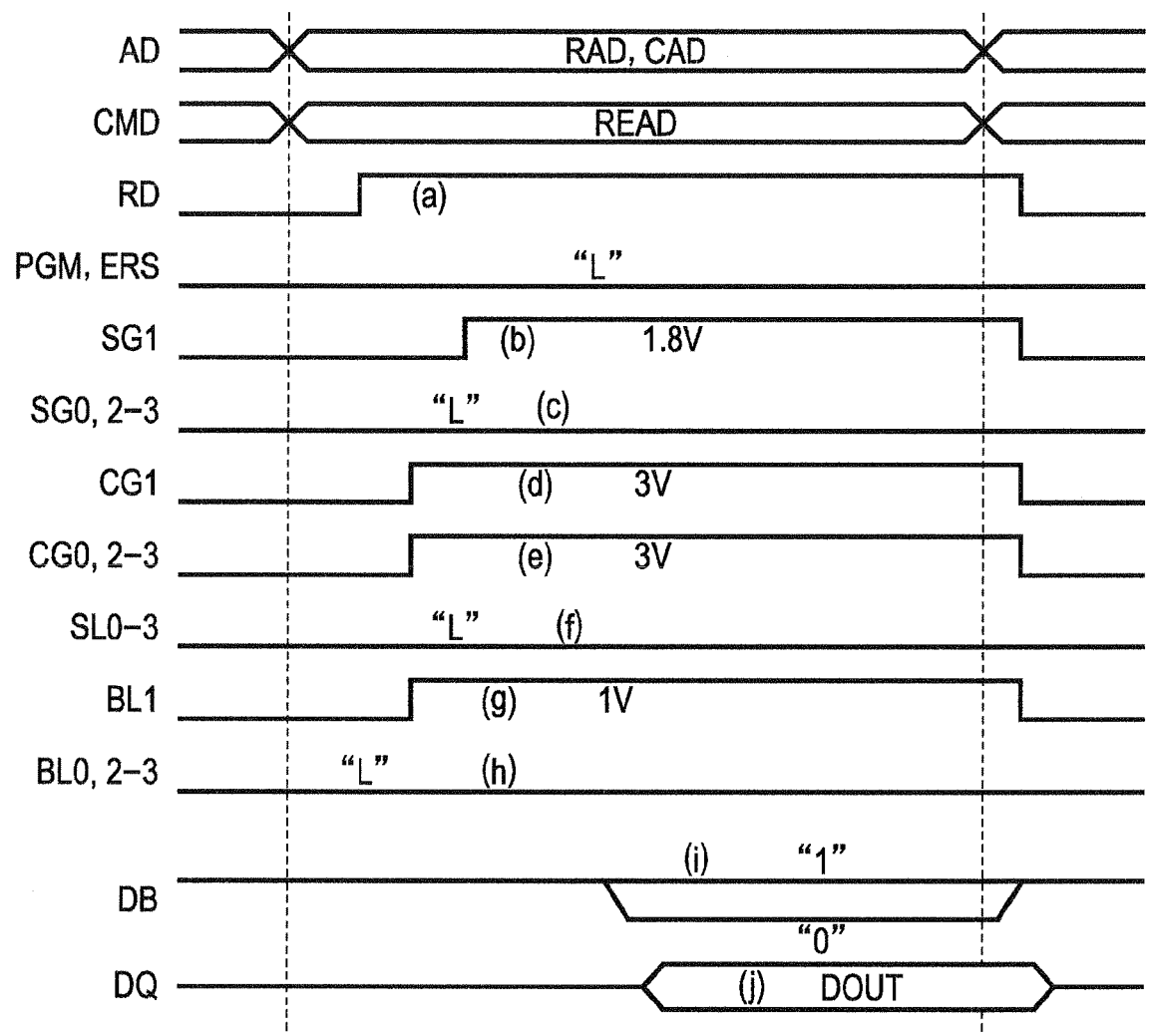
FIG. 9 illustrates an exemplary a read operation of a memory.

FIG. 9 illustrates an exemplary read operation of a memory. The memory may be the memory MEM of FIG. 1. For example, CPU of FIG. 6 supplies a read command READ and the address signal AD such as the row address signal RAD and the column address signal CAD to the memory MEM to start the read operation. The row address signal RAD selects the control gate line CG1, the selection gate line SG1, and the source line SL1 of FIG. 7. The column address signal CAD selects the bit line BL2. As illustrated in FIGS. 7 and 8, the data in the memory cell MC12 is read.

The command register 14 of FIG. 1 sets the read signal RD at a high level in response to the read command READ (FIG. 9(a)). The selection gate driver SGDRV sets the selection gate line SG1 at the high level, for example, 1.8V in response to the read signal RD and the row decode signal supplied from the word decoder WDEC, and the selection gate driver SGDRV maintains the selection gate lines SG0, SG2, and SG3 at a low level (FIG. 9(b, c)). The control gate driver CGDRV sets the control gate lines CG0 to CG3 at the high level, for example, 3V in response to the read signal RD (FIG. 9(d, e)). Because the control gate lines CG0 to CG3 are driven without decoding the row address signal RAD, the control gate lines CG0 to CG3 are changed to the high level earlier than the selection gate line SG1.

The source driver SLDRV maintains the source lines SL0 to SL3 at the low level (FIG. 9(f)). The bit driver BLDRV sets the bit line BL2 at the high level, for example, 1V in response to the read signal RD and the column decode signal supplied from column decoder CDEC, and the bit driver BLDRV maintains the bit lines BL0, BL1, and BL3 at the low level (FIG. 9(g, h)).

When the memory transistor MT of the memory cell MC12 has the low threshold voltage, for example, when the memory cell MC12 is in the erase state, the memory transistor Mt is turned on by setting the control gate line CG1 at the high level. The selection transistor ST is turned on by setting the selection gate line SG1 at the high level. The current passes through memory cell MC12 from the bit line BL2 to the source line SL1. When the memory transistor MT of the memory cell MC12 has the high threshold voltage, for example, when the memory cell MC12 is in the program state, the memory transistor MT is not turned on. As such, the current does not pass from the bit line BL2 to the source line SL1.

The column switch CSW of FIG. 5 couples the bit line BL2 to the global bit line GBL in response to the column address signal CAD. The sense amplifier SA of FIG. 1 determines the logic of the data in the memory cell MC12 according to a value of the current passing through the global bit line GBL. The sense amplifier SA supplies the determined logical "1" or "0" to the data bus DB (FIG. 9(*i*)). The data input and output buffer 10 supplies the data supplied from the data bus DB to the data terminal DQ as the read data DOUT (FIG. 9(*j*)).

Because the control gate lines CG0 to CG3 are driven without decoding the row address signal RAD, the high-level control gate signals CG0 to CG3 are rapidly supplied to the memory transistor MT having the low operating speed. The selection transistor ST having the high operating speed selects the memory cell MC to which the read operation is performed. Because the memory cell current passes from the bit line BL2 to the source line SL1 earlier, the read data DOUT is output earlier. Therefore, the read operation time is shortened.

Figure 10:
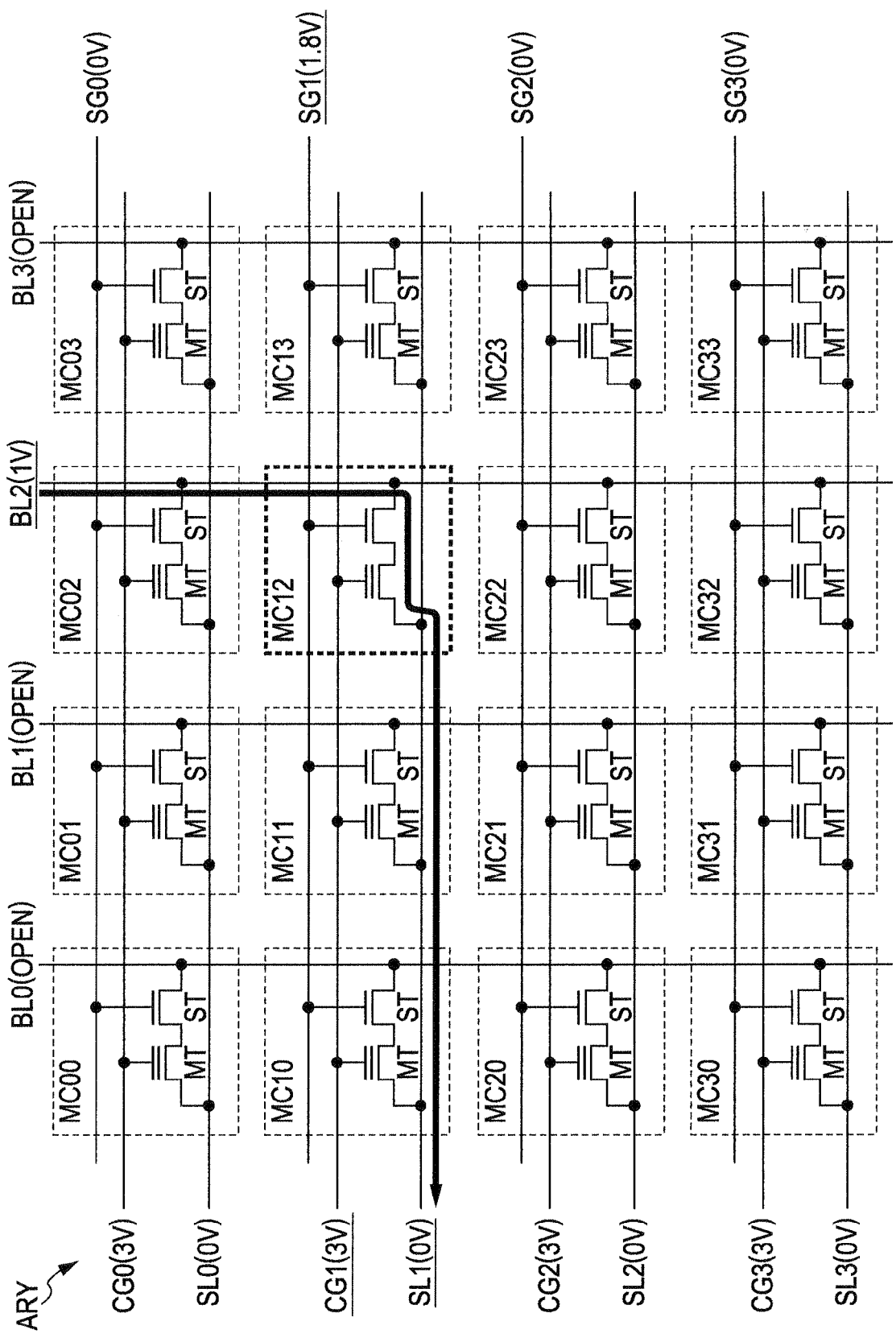
FIG. 10 illustrates an exemplary the memory cell array during a read operation.

FIG. 10 illustrates an exemplary memory cell array during a read operation. For example, the read operation is illustrated in FIG. 9. The memory cell MC12 is selected by the high-level control gate line CG1, the high-level selection gate line SG1, and the high-level bit line BL2. The determination of the logic of the data in the memory cell MC12 is made based on the amount of memory cell current (thick arrow of FIG. 10) passing through the memory cell MC12.

Figure 11:
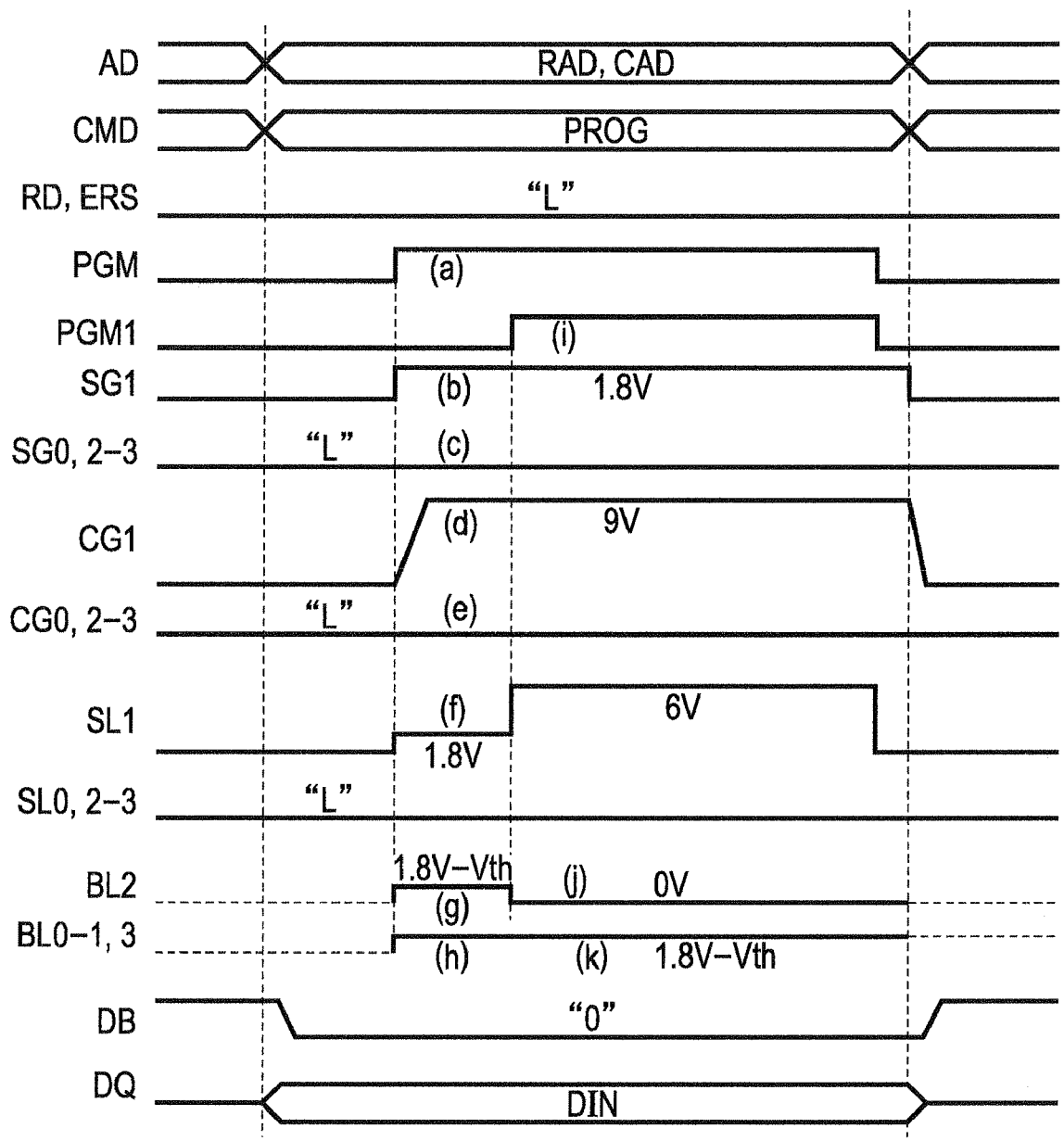
FIG. 11 illustrates an exemplary program operation of a memory.

FIG. 11 illustrates an exemplary program operation of a memory. The memory may be the memory MEM of FIG. 1. For example, CPU supplies a program command PROG, the address signal AD such as the row address signal RAD and the column address signal CAD, and write data DQ such as DIN of the logical "0" to the semiconductor memory MEM to start the program operation. The row address signal RAD selects the control gate line CG1, the selection gate line SG1, and the source line SL1 of FIG. 7. The column address CAD selects the bit line BL2. As illustrated in FIGS. 7 and 8, the memory cell MC12 is programmed.

The command register 14 of FIG. 1 sets the program signal PGM at the high level in response to the program command PROG (FIG. 11(*a*)). The selection gate driver SGDRV sets the selection gate line SG1 at the high level, for example, 1.8V in response to the program signal PGM and the row decode signal supplied from the word decoder WDEC, and the selection gate driver SGDRV maintains the selection gate lines SG0, SG2, and SG3 at the low level (FIG. 11(*b, c*)). The control gate driver CGDRV sets the control gate line CG1 at the high level, for example, 9V in response to the program signal PGM and the row decode signal supplied from the word decoder WDEC, and the control gate driver CGDRV maintains the control gate lines CG0, CG2, and CG3 at the low level (FIG. 11(*d, e*)). In one embodiment, in order to increase the withstand voltage, the memory transistor MT coupled to the control gate line CG1 has a thick gate insulating film and a large load capacity. The voltage at the control gate line CG1 is gently raised compared with the voltage at the selection gate line SG1.

The source driver SLDRV sets the source line SL1 at the high level, for example, VCC=1.8V in response to the program signal PGM and the row decode signal supplied from the word decoder WDEC (FIG. 11F). The selection transistors ST and memory transistors MT of the memory cells MC10 to MC13 are turned on by the high-level selection gate line SG1 and the high-level control gate line CG1. The bit lines BL0 to BL3 are precharged to a voltage that is lower than the voltage at the source line SL1 by the threshold voltage Vth of the selection transistor ST, for example, 0.3 V, for example, 1.8V-Vth (FIG. 11(*g, h*)). The broken lines of bit lines BL0 to BL3 indicate the floating state. The number of types of the internal voltages generated by the voltage generating circuit 18 is decreased because the high level at the source line SL1 and the high level at the selection gate line SG1 are set at substantially the same power supply voltage VCC. Therefore, a circuit scale of the memory MEM is reduced. After a given time, for example, 10 ns elapses from the program signal PGM being changed to the high level, the program signal PGM1 is changed to the high level (FIG. 11(*i*)).

The column switch CSW of FIG. 5 couples the bit line BL2 to the global bit line GBL in response to the column address signal CAD. When the program signal PGM1 is changed to the high level, the global bit line GBL is set at the low level, for example, 0V and the bit line BL2 coupled to the programmed memory cell MC is set at the low level, for example, 0V (FIG. 11(*j*)). For example, the bit lines BL0, BL1, and BL3 are maintained at 1.8V-Vth because the bit lines BL0, BL1, and BL3 are not coupled to the global bit line GBL (FIG. 11(*k*)). When the program signal PGM1 is changed to the high level, the source line SL1 is set at the high level, for example, 6V (FIG. 11(*l*)). The current passes from the source line SL1 to the bit line BL1, and hot electrons are generated in the channel region of the memory transistor MT in the memory cell MC12. The hot electrons are injected and accumulated in the floating gate of the memory transistor MT in the memory cell MC12 through the high-level control gate line CG1. Therefore, the threshold voltage of the memory transistor MT in the memory cell MC12 is raised.

For example, the bit lines BL0, BL1, and BL3 in which the program operation is not performed are maintained at 1.8V-Vth, when the source line SL1 is set at the high level, for example, 6V. For example, the selection gate signal SG1 having the voltage of 1.8V is supplied to the gates of the selection transistors ST in the memory cells MC10, MC11, and MC13. Because the selection transistors ST in the memory cells MC10, MC11, and MC13 are not turned on, the currents are not through the channel regions of the memory transistors MT in the memory cells MC10, MC11, and MC13. The threshold voltage of the memory transistor MT in the memory cells MC10, MC11, and MC13 that are coupled to the control gate line CG1, which is coupled to the programmed memory cell MC12, for example, in the memory cell that is not programmed does not raise. A disturbing phenomenon in which an electrical characteristic is changed in the memory cell that is not programmed may be prevented during the program operation.

The bit lines BL0 to BL3 are pre-charged to voltage VCC-Vth in a period during which the power supply voltage VCC, for example, 1.8V is supplied to the source line SL1. When this condition is satisfied, the timing when the source line SL1 is set at the power supply voltage may be earlier or later than that of rising edges of the control gate signal CG1 and the selection gate signal SG1. The timing when the source line SL1 is set at the power supply voltage is synchronized with the rising edges of the control gate signal CG1 and the the selection gate signal SG1, thereby a number of control signals decreases. Therefore, the circuit scale of the memory MEM is reduced.

Figure 12:
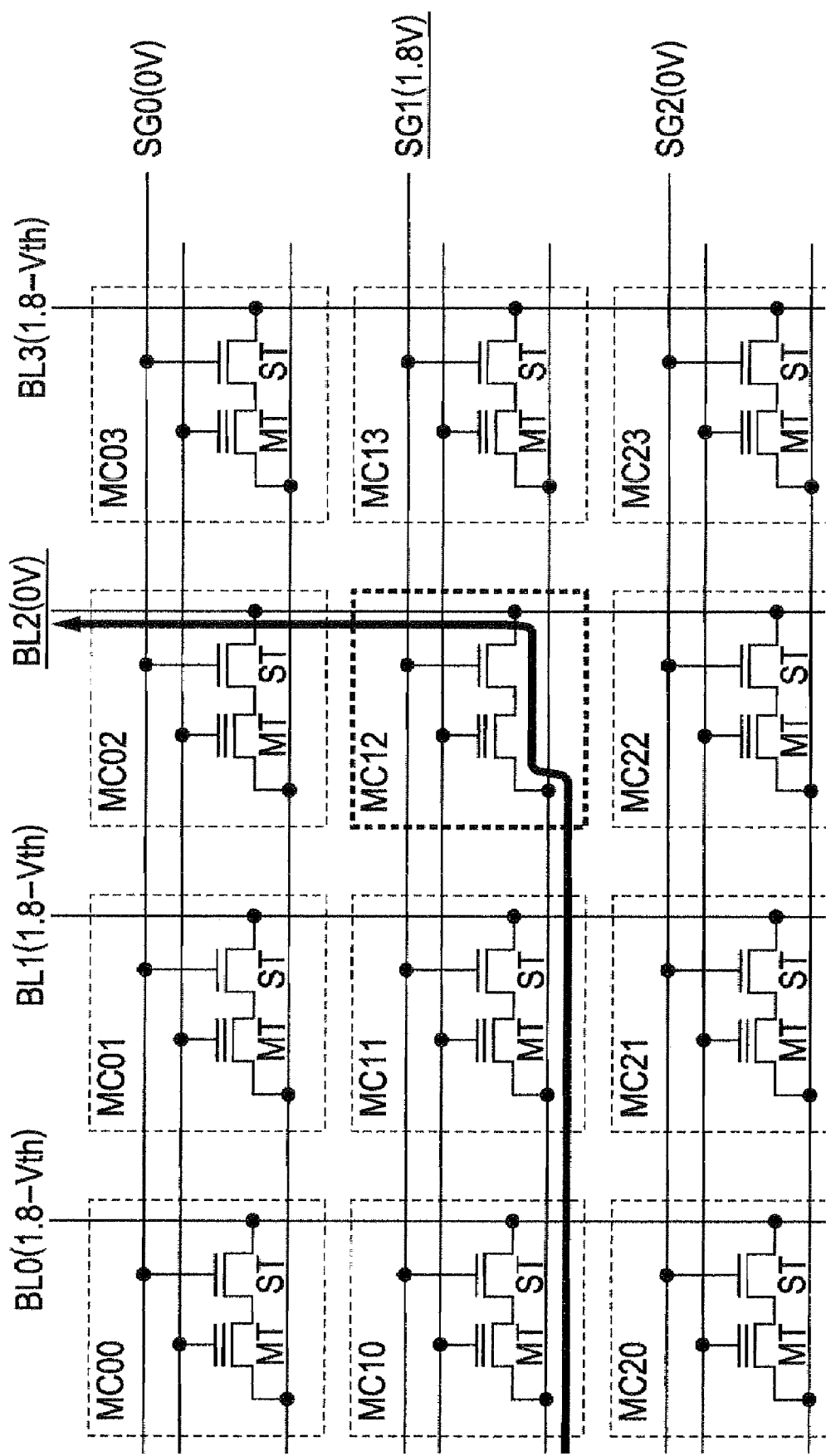
FIG. 12 illustrates an exemplary the memory cell array during a program operation.

FIG. 12 illustrates an exemplary memory cell array during a program operation. For example, the program operation is illustrated in FIG. 11. The memory cell MC12 is selected by the high-level bit line BL2 and the high-level selection gate line SG1. Hot carriers are generated in the channel region of the memory transistor MT in the memory cell MC12 by the current (thick arrow of FIG. 12) passing through the memory cell MC12, and the memory cell MC12 is programmed to the signal "0".

In the first embodiment, during the program operation, while the control gate line CG1 and the selection gate line SG1 are set at the high level, the source line SL1 is temporarily set at the voltage lower than the source voltage VSL (6V) before being set at the source voltage VSL. For example, the voltage that is lower than the source voltage VSL is the power supply voltage VCC of 1.8V that is substantially equal to the high level of the selection gate line SG1. Therefore, the bit lines BL0, BL1, and BL3 coupled to the memory cell MC that is not programmed are precharged without particular circuit. The data in the memory cell MC that is not programmed may not be broken because the current is prevented from passing through the memory transistor MT of the memory cell MC that is not programmed. The operating speed of the memory cell MC is enhanced, because the bit lines BL0, BL1, and BL3 coupled to the memory cell MC that is not programmed are precharged without coupling an excessive load to the bit lines BL0 to BL3.

Figure 13:
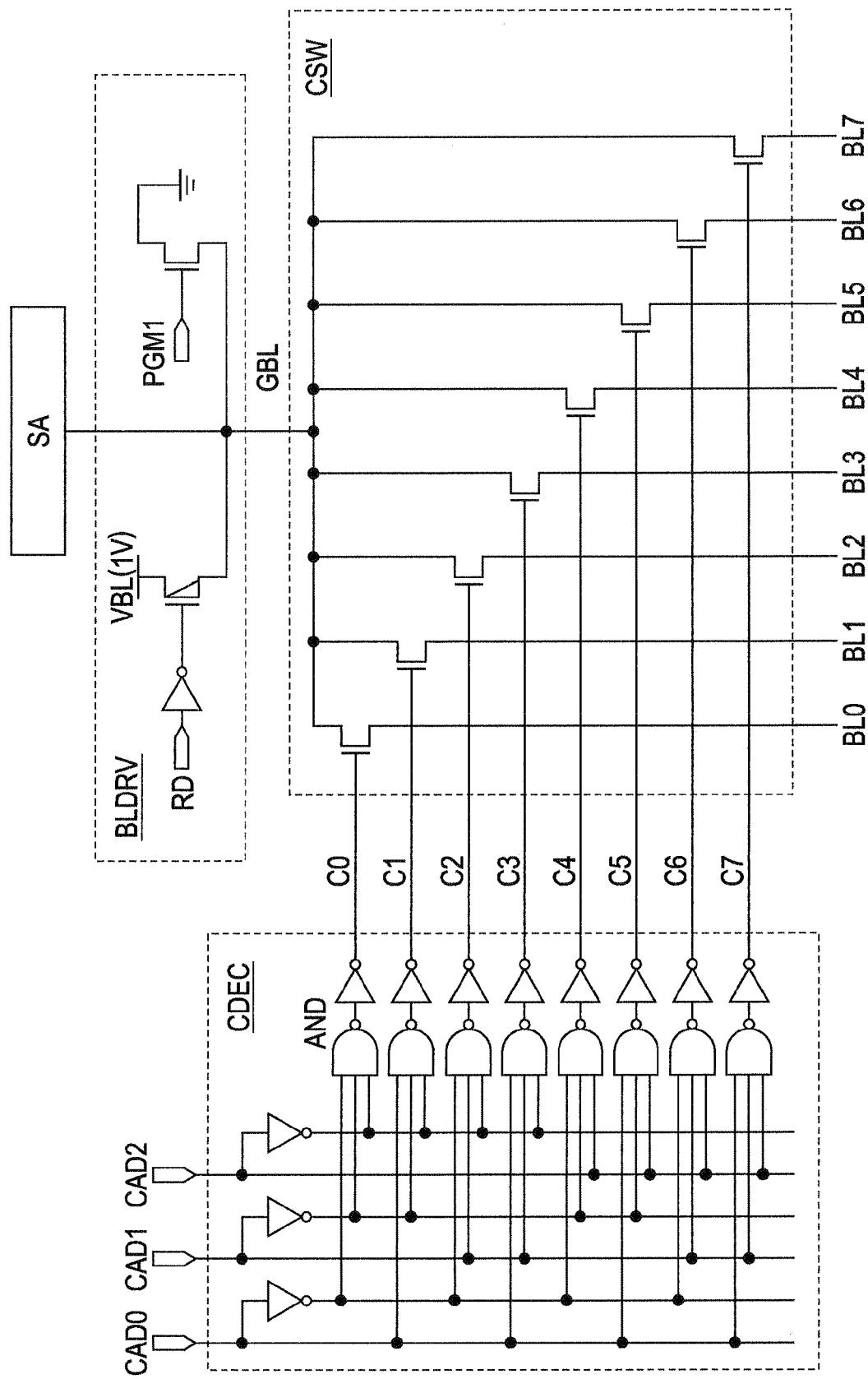
FIG. 13 illustrates a second embodiment.

FIG. 13 illustrates a second embodiment. FIG. 13 illustrates an exemplary column decoder, an exemplary bit driver, and an exemplary column switch. Substantially the same element as the first embodiment is designated by the same numeral, and the description is omitted or reduced. The memory MEM may be a NOR type flash memory. The memory MEM may operate in synchronization with a clock, or the memory MEM may operate in asynchronization with a clock. A column decoder CDEC and a column switch CSW of FIG. 13 differ from the column decoder CDEC and column switch CSW of FIG. 5. Other configurations are substantially the same as or similar to the configurations of FIGS. 1 to 5. For example, FIG. 13 illustrates the circuit block corresponding to one data terminal DQ. In one embodiment, the column address signal CAD may be a threebit signal CAD0 to CAD2, and the bit line BL may be a sevenbit signal BL0 to BL7.

The column decoder CDEC includes an AND circuit that receives the column address signals CAD0 to CAD2 or the inverted signals of the column address signals CAD0 to CAD2. In one embodiment, the AND circuit sets one of the column decode signals C0 to C7 at the high level in response to the column address signals CAD0 to CAD2. For example, the column address signal CAD may be a six-bit signal. The column decoder CDEC outputs 64 column decode signals C0 to C63.

The column switch CSW includes plural nMOS transistors that are disposed between the bit lines BL0 to BL7 and the global bit line GBL. The gates of the nMOS transistors receive the column decode signals C0 to C7. The global bit line GBL is coupled to one of the bit lines BL0 to BL7 in response to the column address signals CAD0 to CAD2. The second embodiment has substantially the same effect as that of the first embodiment.

Figure 14:
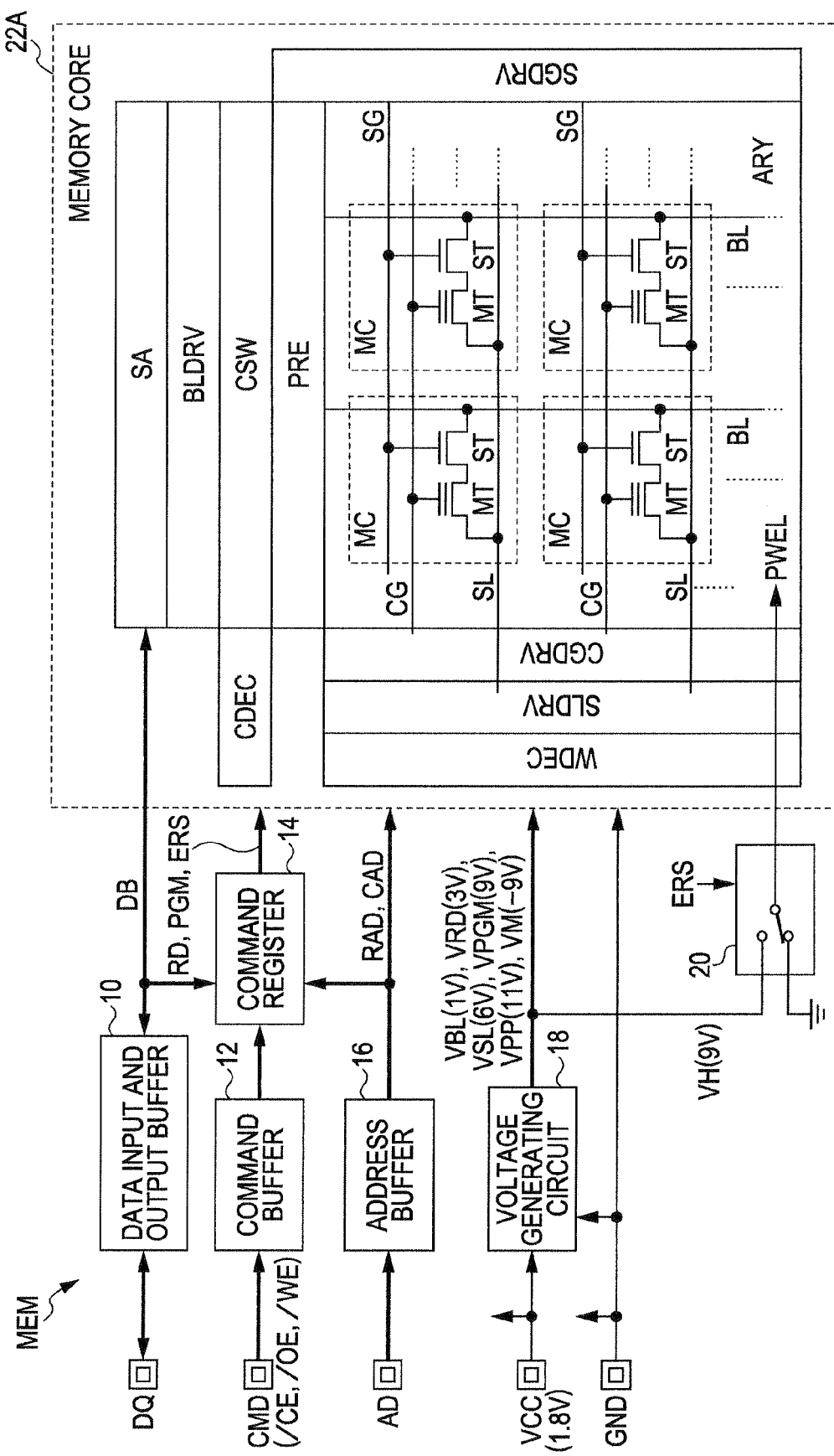
FIG. 14 illustrates a third embodiment.

FIG. 14 illustrates a third embodiment. Substantially the same component as the first and second embodiments is designated by the same numeral, and the description is omitted or reduced. For example, the memory MEM may be a NOR type flash memory. The memory MEM may operate in synchronization with a clock, or the memory MEM may operate in asynchronization with the clock. The memory MEM of FIG. 14 includes a memory core 22A. In the memory core 22A, a precharge circuit PRE may be added to the memory core 22 of FIG. 1. Other configurations of the memory MEM are substantially the same as or similar to the configurations of FIGS. 1 to 5.

Figure 15:
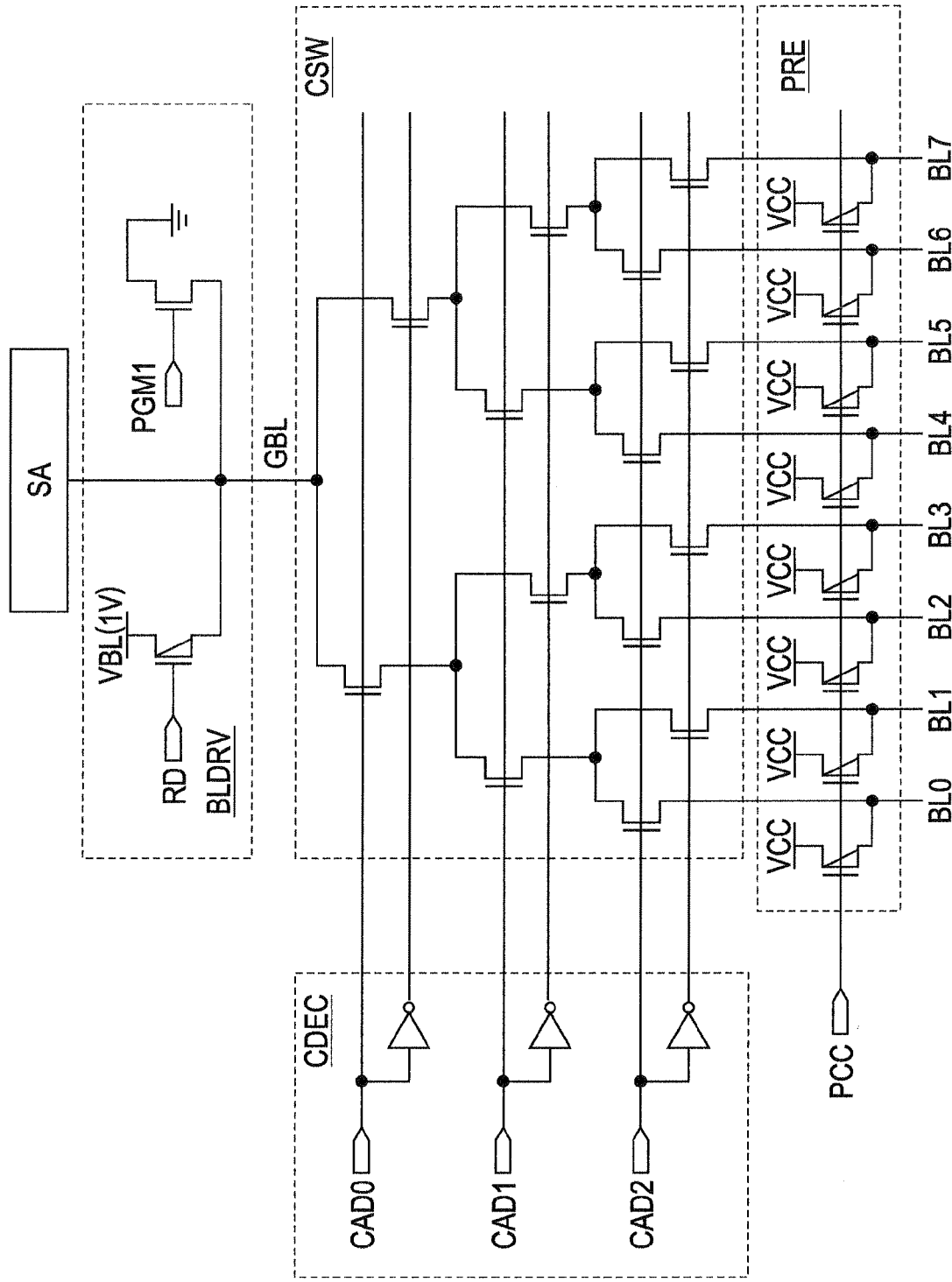
FIG. 15 illustrates an exemplary column decoder, an exemplary bit driver, an exemplary column switch, and an exemplary precharge circuit.

FIG. 15 illustrates an exemplary column decoder, an exemplary bit driver, an exemplary column switch, and an exemplary precharge circuit. The exemplary column decoder, the exemplary bit driver, the exemplary column switch, and the exemplary precharge circuit may be the column decoder CDEC, bit driver BLDRV, column switch CSW, and precharge circuit PRE of FIG. 14. FIG. 15 illustrates a circuit block corresponding to one data terminal DQ. The column decoder CDEC, the bit driver BLDRV, and the column switch CSW may be substantially the same as the column decoder CDEC, the bit driver BLDRV, the column switch CSW, and the precharge circuit PRE of FIG. 5 respectively.

In the depicted embodiment, the precharge circuit PRE includes pMOS transistors, for example, precharge transistors that are disposed between the power supply line VCC and the bit lines BL0 to BL7. The gates of the precharge transistors receive a common precharge signal PCC. The precharge signal PCC is activated to the low level in a given period in response to the program command PROG. While the precharge signal PCC is being activated to the low level, the precharge transistors are turned on to set the bit lines BL0 to BL7 at the precharge voltage VCC. The precharge signal PCC may be generated by the command register 14, or the precharge signal PCC may be generated in the precharge circuit PRE in response to the program command PROG.

Figure 16:
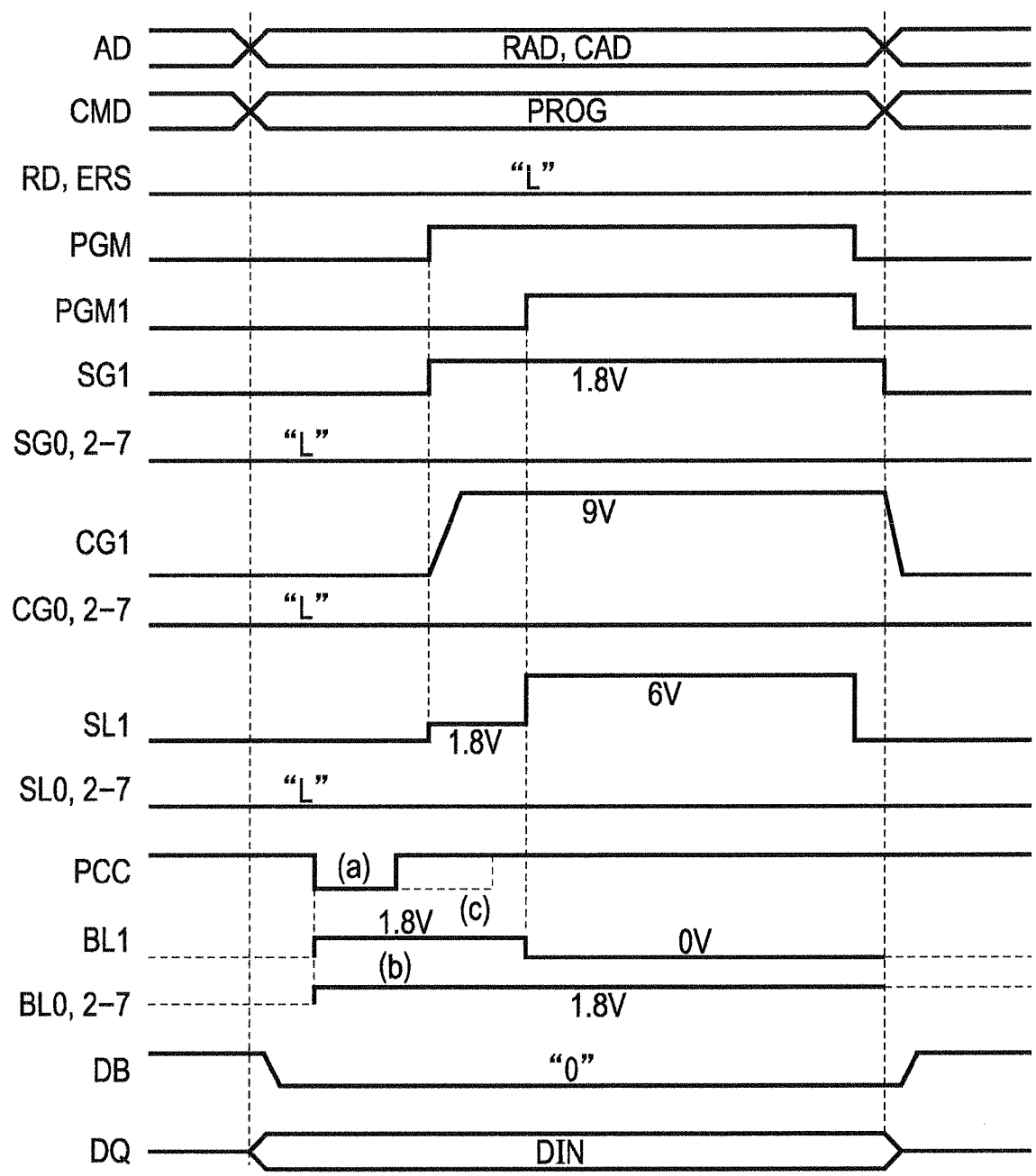
FIG. 16 illustrates an exemplary program operation of a memory.

FIG. 16 illustrates an exemplary program operation of a memory. The memory may be the memory MEM of FIG. 14. The description of the operation substantially the same as that of FIG. 11 is omitted or reduced. As illustrated in FIGS. 7 and 8, for example, the memory cell MC12 is programmed to the signal "0". The precharge signal PCC is activated to the low level before the source line SL1 is set at the power supply voltage VCC, for example, 1.8V (FIG. 16(a)). While the precharge signal PCC is at the low level, the precharge transistors of FIG. 15 is turned on to pre-charge the bit lines BL0 to BL7 to the power supply voltage VCC, for example, a precharge voltage of 1.8V (FIG. 16(b)). Because the bit line BL is set at the precharge voltage, the selection transistor ST of the memory cell MC that is not programmed is not turned on. Therefore, the current does not pass through the channel region of the memory transistor MT. Because the selection transistor ST of the memory cell MC that is not programmed is not turned on, the precharge voltage may be the high level of the selection gate line SG1, for example, equal to or higher a voltage obtained by substracting the threshold voltage Vth of 0.3V of the selection transistor ST from 1.8V.

The precharge signal PCC is deactivated to the high level before the selection gate line SG1 and the control gate line CG1 are changed to the high level. As illustrated by a broken line of FIG. 16, the precharge signal PCC may be deactivated until the source line SL1 is set at the source voltage VSL, for example, 6V after the selection gate line SG1 and the control gate line CG1 are changed to the high level (FIG. 16(c)). Other operations are substantially the same as those of FIG. 11.

The third embodiment has substantially the same effect as those of the first and second embodiments. The precharge transistors of FIG. 15 are turned on by the common precharge signal PCC that is temporarily activated before the source line SL1 is set at the source voltage VSL, for example, 6V. The bit line BL coupled to the memory cell MC that is not programmed is pre-charged without decoding the address signal. Therefore, the bit line BL coupled to the memory cell MC that is not programmed is pre-charged with the simple circuit.

Figure 17:
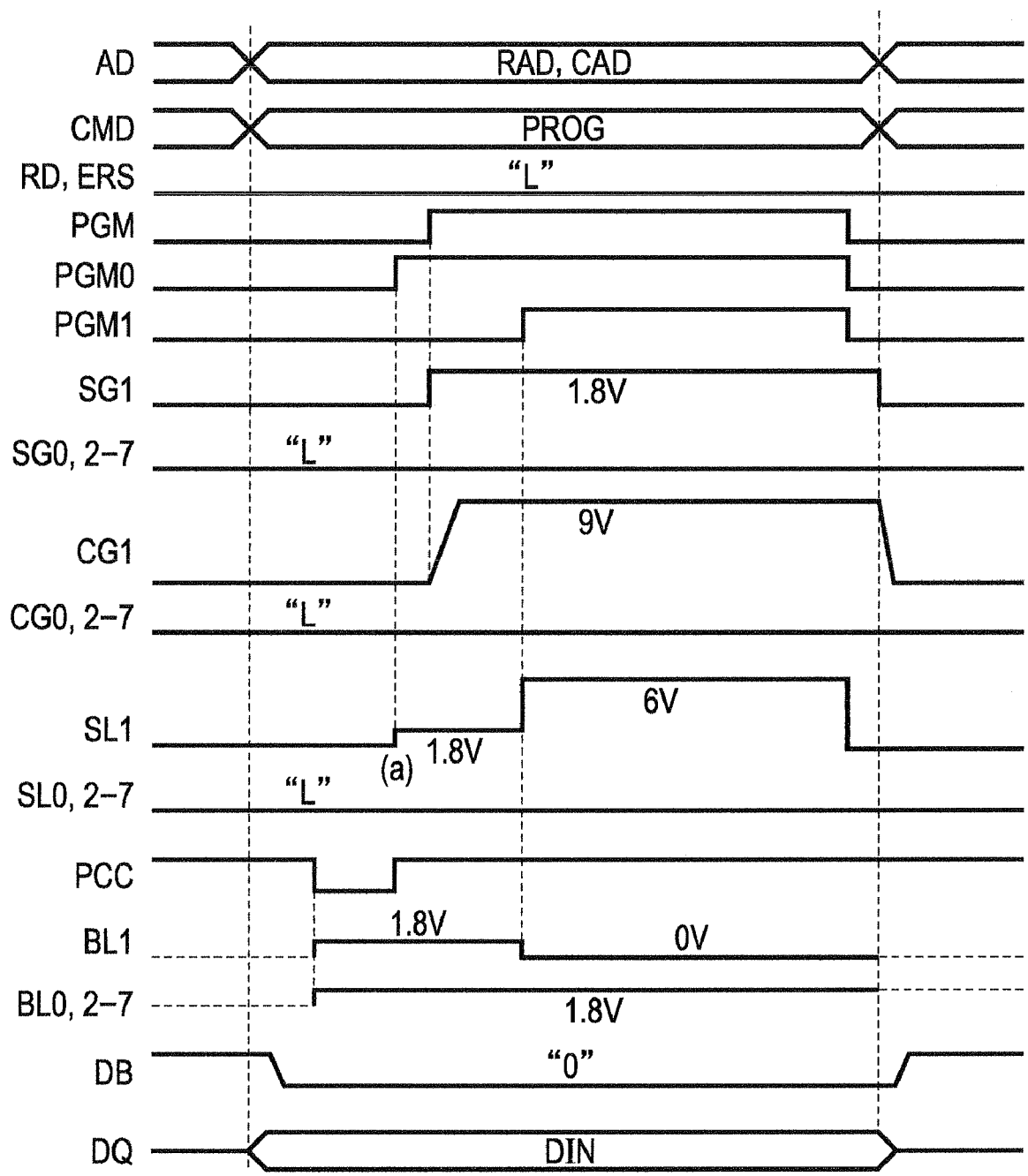
FIG. 17 illustrates a fourth embodiment.

FIG. 17 illustrates a fourth embodiment. FIG. 17 illustrates an exemplary program operation of a memory. The memory may be the memory MEM of FIG. 14. The source line SL1 is set at the power supply voltage VCC, for example, 1.8V before the selection gate line SG1 and the control gate line CG1 are changed to the high level (FIG. 17(a)). For example, the memory MEM sets the source line SL1 at the power supply voltage VCC in response to a program signal PGM0 that is generated earlier than the program signal PGM. For example, the command register 14 generates the program signal PGM0. The sub-source driver SSLDRV of FIG. 2 may receive the program signal PGM0 instead of the program signal PGM. The memory MEM may be a NOR type flash memory. The memory MEM may operate in synchronization with a clock, or the memory MEM may operate in asynchronization with the clock.

In the depicted embodiment, the selection gate line SG1 and the control gate line CG1 are not changed to the high level while the source line SL1 is at the low level. Therefore, the charges of the bit line BL pre-charged by the precharge circuit PRE does not pass through the low-level source line SL1, and the current does not pass through the channel region of the memory transistor MT in the memory cell MC that is not programmed. The data in the memory cell that is not programmed is not broken. The fourth embodiment has substantially the same effect as those of the first to third embodiments.

Figure 18:
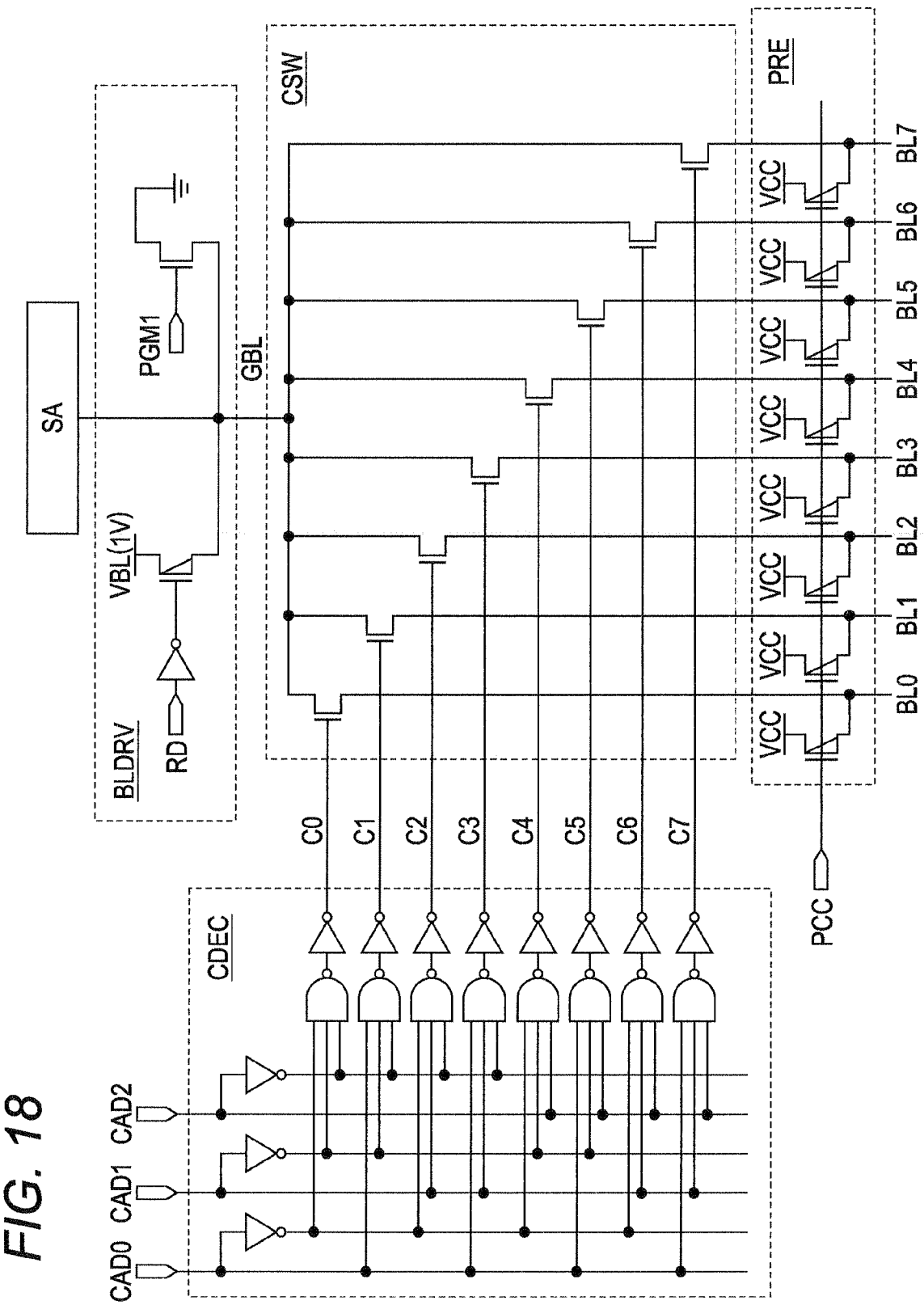
FIG. 18 illustrates a fifth embodiment.

FIG. 18 illustrates a fifth embodiment. FIG. 18 illustrates an exemplary column decoder CDEC, an exemplary bit driver BLDRV, and an exemplary column switch CSW. Substantially the same elements as the first to fourth embodiments is designated by the same numeral, and the description is omitted or redured. For example, the semiconductor memory MEM may be a NOR type flash memory. The semiconductor memory MEM may operate in synchronization with a clock, or the memory MEM may operate in asynchronization with the clock. The semiconductor memory MEM may includes the column decoder CDEC and column switch CSW of FIG. 13. The semiconductor memory MEM may include the precharge circuit PRE of FIG. 15. Other configurations are substantially the same as or similar to those of FIGS. 1 to 5. For example, FIG. 17 illustrates the circuit block corresponding to one data terminal DQ. The column address signal CAD may be a three-bit signal CAD0 to CAD2, and the bit line BL may be a seven-bit signal BL0 to BL7. The fifth embodiment has substantially the same effect as those of the first to fourth embodiments.

Example embodiments of the present invention have now been described in accordance with the above advantages. It will be appreciated that these examples are merely illustrative of the invention. Many variations and modifications will be apparent to those skilled in the art.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The invention claimed is:

1. A memory comprising:
a plurality of memory cells each of which includes a memory transistor and a selection transistor coupled to the memory transistor;
a control gate line commonly coupled to gates of the memory transistors;
a selection gate line commonly coupled to gates of the selection transistors;
a source line commonly coupled to the memory cells;
a bit line coupled to each of the memory cells;
a first driver that sets the control gate line and the selection gate line at a first voltage in a program operation of the memory cell;
a second driver that sets the source line at a second voltage in the program operation, and sets the source line at a third voltage higher than the second voltage while the control gate line and the selection gate line are set at the first voltage; and
a third driver that sets the bit line at a fourth voltage after the source line is set at the second voltage, the bit line being coupled to a memory cell being programmed.

2. The memory according to claim 1, further comprising:
a precharge circuit that is disposed between the bit line and a precharge voltage line and turns on while a common precharge signal is activated; and
a precharge control circuit that activates the common precharge signal before the source line is set at the second voltage.

3. The memory according to claim 2, wherein the precharge circuit sets the bit line at a precharge voltage, and
wherein the precharge voltage is substantially equal to or higher than a voltage obtained by subtracting a threshold voltage of the selection transistor from the first voltage.

4. The memory according to claim 1, further comprising:
a column switch that is disposed between the third driver and the bit line and couples the third driver to one of the bit lines in response to an address signal.

5. The memory according to claim 1, wherein the second voltage is substantially the same as the first voltage.

6. The memory according to claim 1, wherein the first voltage, the second voltage, and the third voltage are a voltage on a high voltage side, and
wherein the fourth voltage is a voltage on a low voltage side.

7. A memory operating method comprising:
setting, in a program operation of a memory that includes a plurality of memory cells each of which includes a memory transistor and a selection transistor coupled to the memory transistor, a control gate line commonly coupled to gates of the memory transistors, a selection gate line commonly coupled to gates of the selection transistors, a source line commonly coupled to the memory cells, and a bit line coupled to each of the memory cells, the control gate line and the selection gate line at a first voltage;
setting the source line at a second voltage;
setting the source line at a third voltage higher than the second voltage while the control gate line and the selection gate line are set at the first voltage; and
setting the bit line at a fourth voltage after the source line is set at the second voltage, wherein the bit line is coupled to a memory cell being programmed.

8. The memory operating method according to claim 7, further comprising:
turning on a precharge circuit disposed between the bit line and a precharge voltage line before at least the source line is set at the first voltage.

9. A memory system comprising:
a memory; and
a controller that accesses the memory,
wherein the memory includes:
a plurality of memory cells each of which includes a memory transistor and a selection transistor coupled to the memory transistor;
a control gate line commonly coupled to gates of the memory transistors;

a selection gate line commonly coupled to gates of the selection transistors;
a source line commonly coupled to the memory cells;
a bit line coupled to each of the memory cells;
a first driver that sets the control gate line and the selection gate line at a first voltage in a program operation of the memory cell;
a second driver that sets the source line at a second voltage in the program operation, and sets the source line at a third voltage higher than the second voltage while the control gate line and the selection gate line are set at the first voltage; and
a third driver that sets the bit line at a fourth voltage after the source line is set at the second voltage, the bit line being coupled to a memory cell being programmed.

* * * * *